(12) United States Patent
Yang et al.

(10) Patent No.: US 10,840,190 B1
(45) Date of Patent: Nov. 17, 2020

(54) SEMICONDUCTOR STRUCTURE AND MANUFACTURING METHOD THEREOF

(71) Applicant: Taiwan Semiconductor Manufacturing Co., Ltd., Hsinchu (TW)

(72) Inventors: Ching-Jung Yang, Taoyuan (TW); Hsien-Wei Chen, Hsinchu (TW); Ming-Fa Chen, Taichung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/413,605

(22) Filed: May 16, 2019

(51) Int. Cl.
    *H01L 23/538* (2006.01)
    *H01L 21/768* (2006.01)
    *H01L 25/065* (2006.01)

(52) U.S. Cl.
    CPC .... *H01L 23/5384* (2013.01); *H01L 21/76802* (2013.01); *H01L 23/5385* (2013.01); *H01L 23/5386* (2013.01); *H01L 25/0657* (2013.01)

(58) Field of Classification Search
    CPC ............. H01L 23/5384; H01L 23/5385; H01L 21/76802; H01L 23/5386
    See application file for complete search history.

(56) References Cited

U.S. PATENT DOCUMENTS

| | | | |
|---|---|---|---|
| 8,993,380 B2 | 3/2015 | Hou et al. | |
| 9,281,254 B2 | 3/2016 | Yu et al. | |
| 9,299,649 B2 | 3/2016 | Chiu et al. | |
| 9,372,206 B2 | 6/2016 | Wu et al. | |
| 9,425,126 B2 | 8/2016 | Kuo et al. | |
| 9,443,783 B2 | 9/2016 | Lin et al. | |
| 9,461,018 B1 | 10/2016 | Tsai et al. | |
| 9,496,189 B2 | 11/2016 | Yu et al. | |
| 9,666,502 B2 | 5/2017 | Chen et al. | |
| 9,735,131 B2 | 8/2017 | Su et al. | |
| 9,748,206 B1* | 8/2017 | Huang | H01L 25/0657 |
| 2016/0351546 A1* | 12/2016 | Tsai | H01L 21/31051 |
| 2017/0005054 A1* | 1/2017 | Chiu | H01L 23/5386 |
| 2017/0221858 A1* | 8/2017 | Yu | H01L 23/5227 |
| 2017/0301715 A1* | 10/2017 | Cheng | H01L 27/14636 |
| 2019/0164914 A1* | 5/2019 | Hu | H01L 23/585 |

* cited by examiner

*Primary Examiner* — Ahmed N Sefer
(74) *Attorney, Agent, or Firm* — JCIPRNET

(57) ABSTRACT

A semiconductor structure and the manufacturing method thereof are provided. A semiconductor structure includes a first semiconductor substrate, a first interconnect structure, a first conductive pad, a first dielectric layer, and a first conductive connector. The first semiconductor substrate includes a plurality of first semiconductor devices therein. The first interconnect structure is disposed over the first semiconductor substrate and electrically coupled to the first semiconductor devices. The first conductive pad is disposed over and electrically coupled to the first interconnect structure. The first dielectric layer covers the first conductive pad and the first interconnect structure, and the first dielectric layer includes a portion extending through the first conductive pad. The first conductive connector is disposed on and electrically coupled to the first interconnect structure, and the first conductive connector extends through the portion of the first dielectric layer.

20 Claims, 22 Drawing Sheets

SEMICONDUCTOR STRUCTURE AND MANUFACTURING METHOD THEREOF

BACKGROUND

In recent years, the semiconductor industry has experienced rapid growth due to continuous improvement in integration density of various electronic components, e.g., transistors, diodes, resistors, capacitors, etc. For the most part, this improvement in integration density has come from successive reductions in minimum feature size, which allows more components to be integrated into a given area. For example, the area occupied by integrated components is proximate to the surface of a semiconductor wafer; however, there are physical limitations to an achievable density in two-dimensional (2D) integrated circuit formation. For example, one of these limitations comes from the significant gains in the number and length of interconnections between semiconductor devices as the number of semiconductor devices increases. As the existing integrated circuit design rules require a decreasing pitch for laying out conductive wirings in a semiconductor structure, there is continuous effort in developing new mechanisms of forming semiconductor structures.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
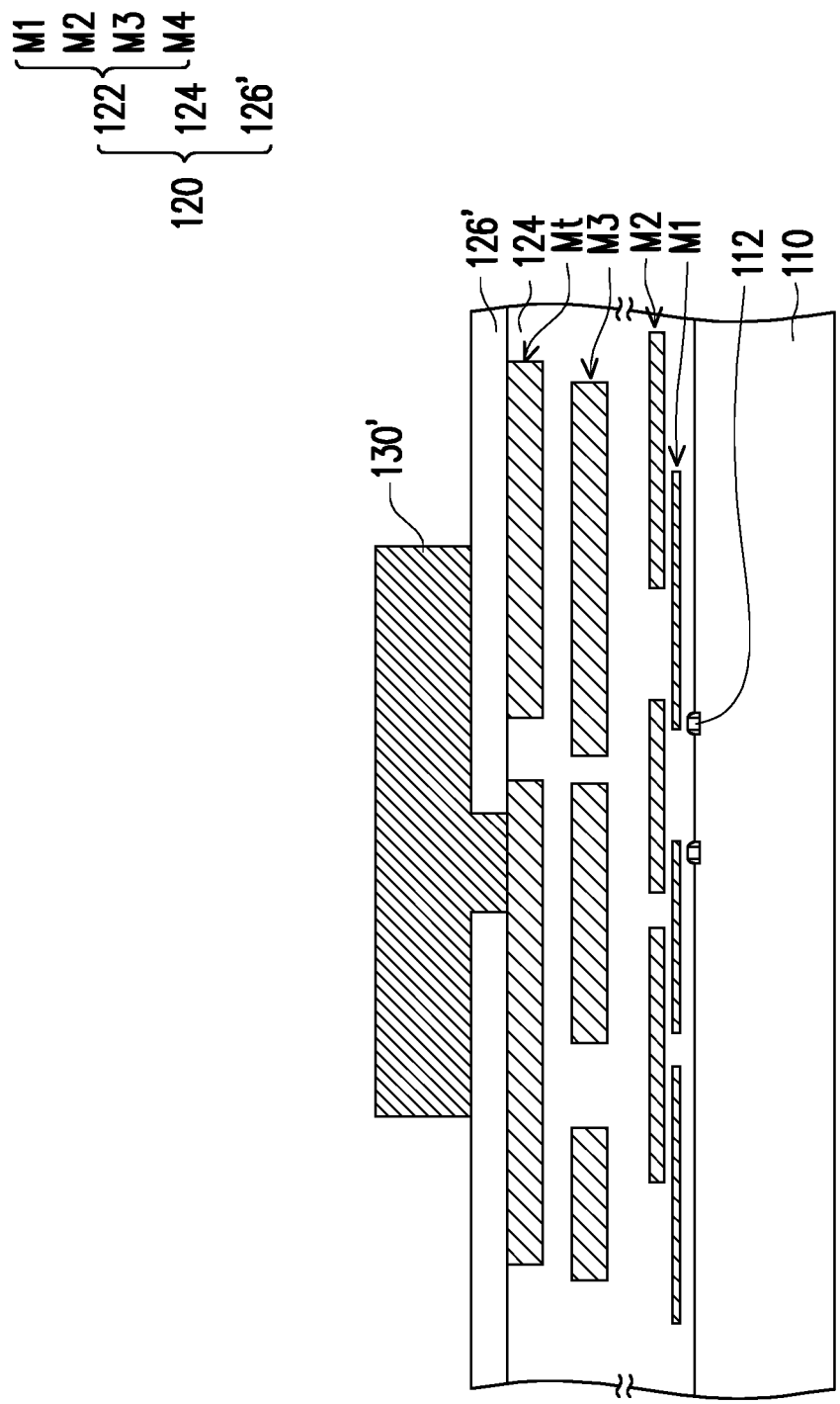
FIG. 1A to FIG. 1F are schematic cross-sectional views showing various stages in a manufacturing method of a tier of a semiconductor structure according to some exemplary embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Figure 1B:
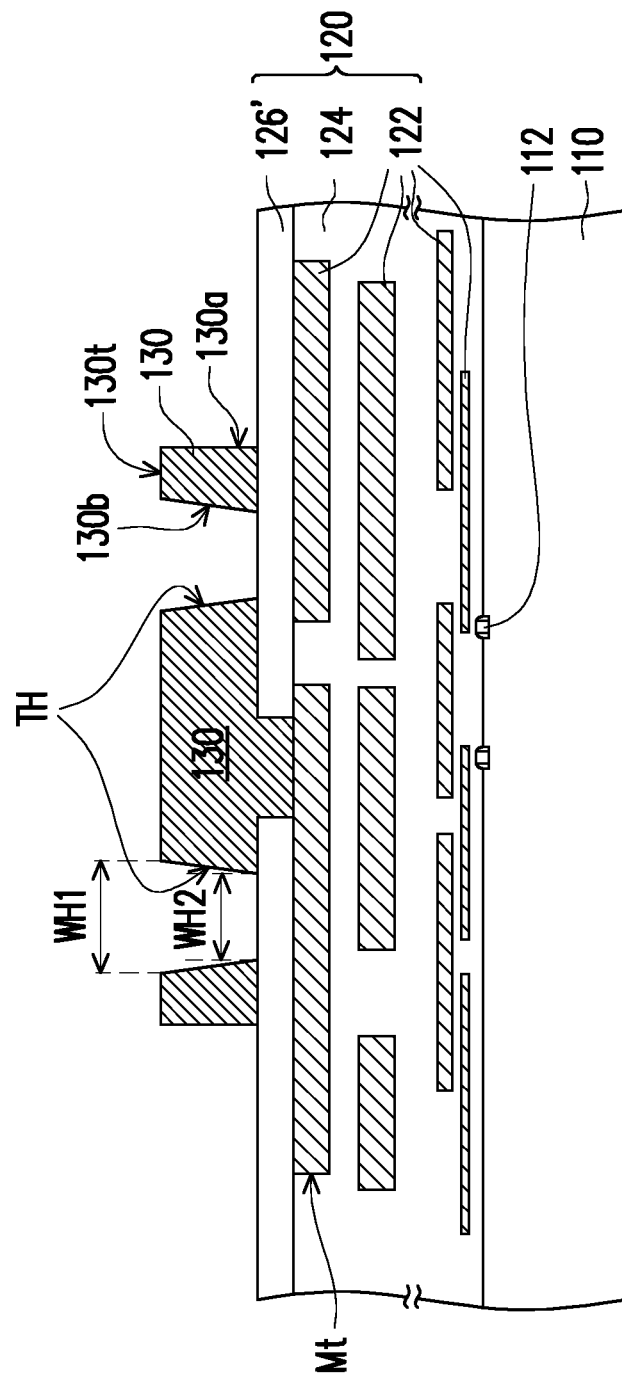

FIG. 1A to FIG. 1F are schematic cross-sectional views showing various stages in a manufacturing method of a tier of a semiconductor structure according to some exemplary embodiments of the present disclosure. Referring to FIG. 1A and FIG. 1B, an interconnect structure 120 is formed on a semiconductor substrate 110. For example, the semiconductor substrate 110 includes a bulk semiconductor, a semiconductor-on-insulator (SOI) substrate, other supporting substrate (e.g., quartz, glass, etc.), combinations thereof, or the like, which may be doped or undoped. In some embodiments, the semiconductor substrate 110 includes an elementary semiconductor (e.g., silicon or germanium in a crystalline, a polycrystalline, or an amorphous structure, etc.), a compound semiconductor (e.g., silicon carbide, gallium arsenide, gallium phosphide, indium phosphide, indium arsenide, and/or indium antimonide, etc.), an alloy semiconductor (e.g., silicon-germanium (SiGe), gallium arsenide phosphide (GaAsP), aluminum indium arsenide (AlInAs), aluminium gallium arsenide (AlGaAs), gallium indium arsenide (GaInAs), gallium indium phosphide (GaInP), etc.), combinations thereof, or other suitable materials. For example, the compound semiconductor substrate may have a multilayer structure, or the substrate may include a multilayer compound semiconductor structure. In some embodiments, the alloy SiGe is formed over a silicon substrate. In other embodiments, a SiGe substrate is strained. In some embodiments, the semiconductor substrate 110 is a device wafer. For example, the semiconductor substrate 110 includes a plurality of semiconductor devices 112 formed therein. The semiconductor devices 112 may be or may include active devices (e.g., transistors, diodes, etc.) and/or passive devices (e.g., capacitors, resistors, inductors, etc.), or other suitable electrical components.

The semiconductor substrate 110 may include circuitry (not shown) formed in a front-end-of-line (FEOL), and the interconnect structure 120 may be formed in a back-end-of-line (BEOL). In some embodiments, the interconnect structure 120 includes an inter-layer dielectric (ILD) layer formed over the semiconductor substrate 110 and covering the semiconductor devices 112, and an inter-metallization dielectric (IMD) layer formed over the ILD layer. In some embodiments, the ILD layer and the IMD layer are formed of a low-K dielectric material, such as phosphosilicate glass (PSG), borophosphosilicate glass (BPSG), SiOxCy, Spin-On-Glass, Spin-On-Polymers, silicon carbon material, compounds thereof, composites thereof, combinations thereof, or the like. The ILD layer and the IMD layer may include any suitable number of dielectric material layers which is not limited thereto.

In some embodiments, the interconnect structure 120 interconnects the semiconductor devices 112. For example, the interconnect structure 120 includes at least one dielectric layer 124 disposed on the semiconductor substrate 110, and a plurality of interconnecting layers 122 embedded in the dielectric layers 124. For example, each of the interconnecting layers 122 includes conductive lines, conductive pads, conductive vias, etc. A material of the interconnecting layers 122 may include copper or copper alloys, although other metals (e.g., aluminum, silver, gold, and combinations thereof) may also be used. In some embodiments, two or more layers of conductive lines of the interconnecting layers 122 are vertically interconnected by conductive vias of the interconnecting layers 122 and embedded in the dielectric layer 124. The interconnecting layers 122 of the interconnect structure 120 disposed over the semiconductor substrate 110 may be electrically coupled to the semiconductor devices 112 formed in and/or on the semiconductor substrate 110 to one another and to external components.

For example, the interconnecting layers 122 of the interconnect structure 120 includes a bottom interconnecting layer M1, a top interconnecting layer Mt, and intermediate level(s) of the interconnecting layers therebetween (e.g., a second-level interconnecting layer M2 immediately over the bottom interconnecting layer M1, a third-level interconnecting layer M3 immediately beneath the top interconnecting layer Mt, and other interconnecting layers (not shown) between the second-level interconnecting layer M2 and the third-level interconnecting layer M3). For ease of description, the term "top" is used herein to refer to one of the layers that is most distal to the semiconductor substrate 110, and the term "bottom" is used to refer to one of the layers that is most proximal to the semiconductor substrate 110, relative to other layers. It should be noted that a four-level interconnecting layer structure illustrated in the figures is merely exemplary, the interconnect structure 120 may include more or less interconnecting layers depending on requirements of circuit design. In some embodiments, at least one passivation layer 126' of the interconnect structure 120 is disposed on the dielectric layer 124 and partially covers the top interconnecting layer Mt of the interconnecting layers 122. In some embodiments, the passivation layer 126' is a non-low-k dielectric layer. For example, the passivation layer 126' is formed of silicon oxide, silicon nitride, un-doped silicate glass, polyimide, or the like. Alternatively, the passivation layer 126' is omitted. The passivation layer 126' may include openings (not labeled) accessibly exposing at least a portion of the top interconnecting layer Mt for further electrical connection.

In some embodiments, a conductive material is formed on the passivation layer 126' and inside the openings of the passivation layer 126' to be in physical and electrical contact with the underlying interconnecting layers 122 (e.g., top interconnecting layer Mt). Next, a portion of the conductive material is removed to form a patterned conductive pad 130 having through hole(s) TH. A material of the conductive pad 130 may include aluminum, but other suitable conductive materials (e.g., copper) may be used. In some embodiments, after forming the conductive material on the passivation layer 126' and inside the openings of the passivation layer 126', the conductive material is patterned to form a conductive pad 130'. It should be noted that although only one conductive pad 130' is illustrated, multiple conductive pads may be formed on the interconnect structure 120. In some embodiments, the conductive pad 130' may be a test pad which allows functional tests. Subsequently, a portion of the conductive pad 130' is removed to form the through hole(s) TH of the patterned conductive pad 130. For example, the forming process of the through holes TH is performed after testing. In some embodiments, a portion of the passivation layer 126' is exposed by the through holes TH of the patterned conductive pad 130 as shown in FIG. 1B. It should be noted that the structure described in conjunction with FIG. 1B is merely exemplary. In other embodiments, a portion of the top interconnecting layer Mt of the interconnecting layers 122 is exposed by the through holes TH of the patterned conductive pad 130.

In some embodiments, after forming the conductive material on the passivation layer 126' and inside the openings of the passivation layer 126', the conductive material is patterned to form the patterned conductive pad 130 having the through holes TH in one time. In some embodiments, after forming the conductive material, lithography and etching may be used to form the patterned conductive pad 130. For example, the lithography techniques involve depositing a photoresist material (not shown) on the conductive material, which is subsequently irradiated (or exposed) and developed to remove a portion of the photoresist material. The remaining photoresist material protects the underlying materials from subsequent etching steps. A suitable etching process, such as a reactive ion etch or other dry etch, an isotropic or anisotropic wet etch, or any other suitable etch or patterning process may be applied to the conductive material to remove exposed portions of the conductive material until the underlying passivation layer 126' is exposed, such that the patterned conductive pad 130 including through holes TH is formed. Subsequently, stripping solutions tailored for the photoresist material followed by etching to remove any photoresist residue. It should be noted that alternative processes may be used to form the patterned conductive pad 130 with the through holes TH.

In some embodiments, the outer sidewall 130a of the patterned conductive pad 130 is substantially vertical and substantially perpendicular to the top surface of the passivation layer 126'. In some embodiments, the through holes TH are tapered from the top surface 130t of the patterned conductive pad 130 to the passivation layer 126'. In some embodiments, one of through holes TH includes a top width WH1 greater than a bottom width WH2 thereof. For example, a width of one of through holes TH gradually increases in a direction towards the top surface 130t of the patterned conductive pad 130, thereby creating sloped inner sidewalls 130b of the patterned conductive pad 130. The top surface 130t is connected to the inner sidewalls 130b and the outer sidewall 130a. It should be noted that the structure described in conjunction with FIG. 1B is merely exemplary, in other embodiments, the outer sidewall 130a and/or the inner sidewalls 130b of the patterned conductive pad 130 may be tilted or may be substantially vertical depending on the forming process of the through holes TH.

Figure 1C:
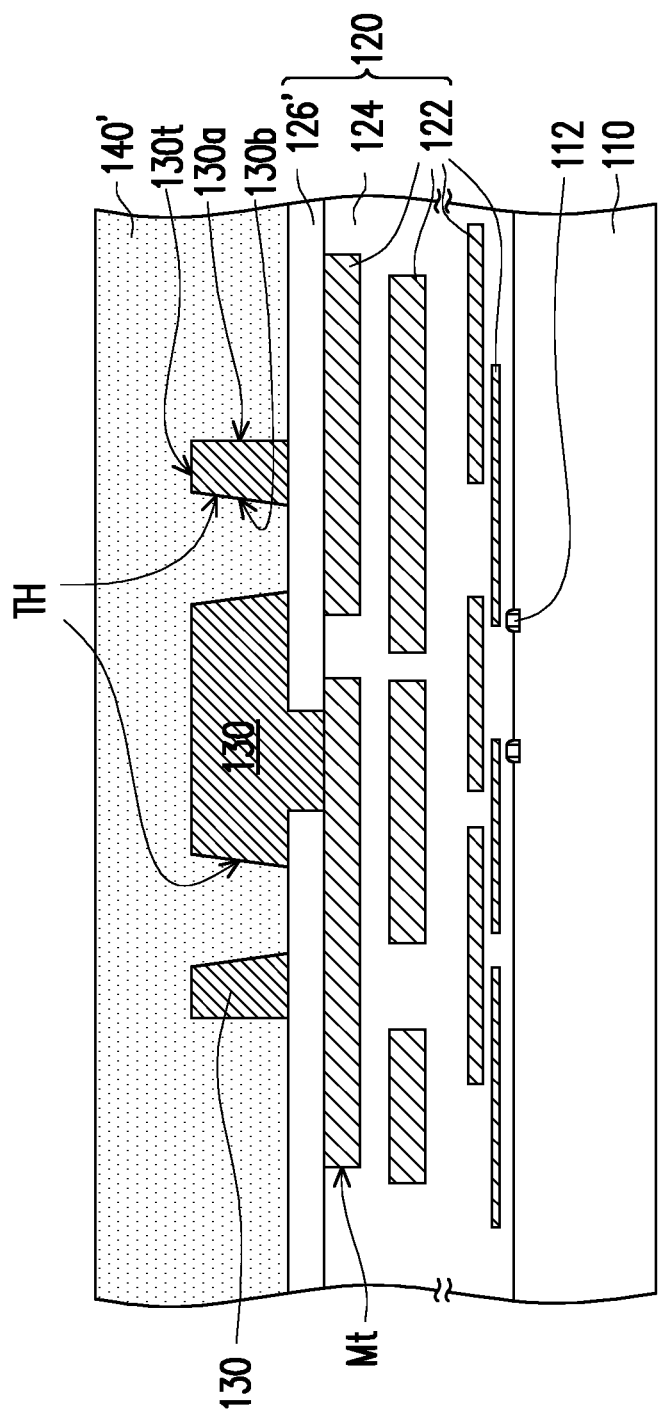
Figure 1D:
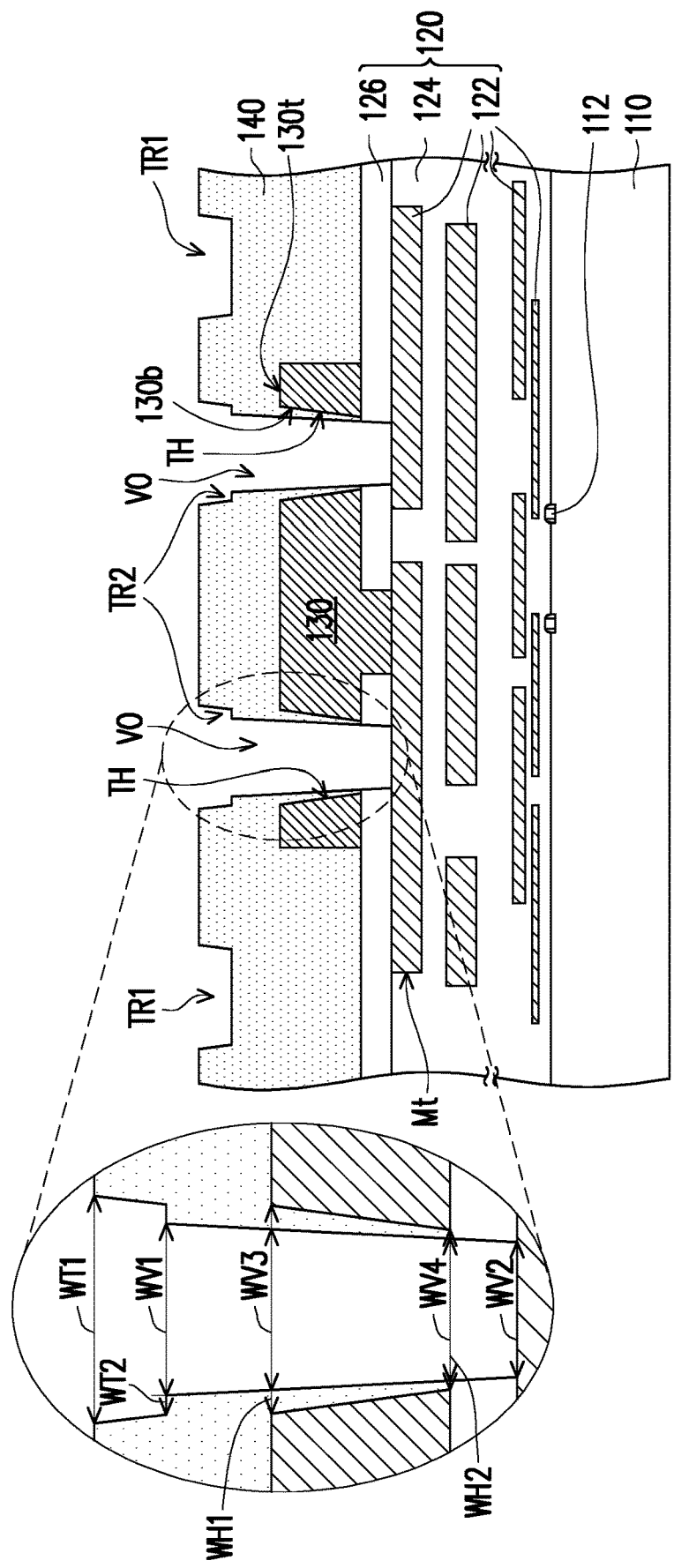

Referring to FIG. 1C and FIG. 1D, a dielectric material 140' is formed on the passivation layer 126' to cover the patterned conductive pad 130. For example, the top surface 130t, the outer sidewall 130a, and the inner sidewall 130b of the patterned conductive pad 130 are covered by the dielectric material 140'. In some embodiments, the through holes TH of the patterned conductive pad 130 are filled with the dielectric material 140'. The dielectric material 140' may be or may include any suitable electrically insulating material for the subsequent bonding process. In some embodiments, the dielectric material 140' includes a silicon-containing dielectric layer. For example, the dielectric material 140' includes silicon oxide (SiO), silicon oxynitride (SiON), silicon nitride (SiN), or the like, and may be formed by a deposition process (e.g., chemical vapor deposition (CVD), physical vapor deposition (PVD), etc.) or other suitable techniques.

Next, portions of the dielectric material 140' and the underlying passivation layer 126' may be removed to respectively form a patterned dielectric layer 140 and a patterned passivation layer 126. For example, a damascene technique or other suitable patterning process may be used. In some embodiments, a dual damascene process is performed on the dielectric material 140' and the underlying passivation layer 126'. For example, a plurality of trench openings TR1 and TR2 are formed in the dielectric material 140', and a plurality of via openings VO are form in the dielectric material 140' and the passivation layer 126' and extend from the corresponding trench openings TR2. The trench openings TR1 and TR2 may be formed as a sporadic recess pattern distributed on the dielectric material 140'. The via openings VO may pass through the underlying passivation layer 126' to form the patterned passivation layer 126 accessibly exposing the top interconnecting layer Mt of the interconnecting layers 122. In other embodiments, the via openings VO may further extend into the dielectric layer 124 of the interconnect structure 120 to expose any level(s) of the interconnecting layers 122 beneath the top interconnecting layer Mt depending on the design requirements. It should be appreciated that the dual damascene technique described in conjunction with FIG. 1D is merely exemplary, and a single damascene process or other suitable patterning process may be used in other embodiments.

In some embodiments, the via openings VO and the trench openings TR1 and TR2 are formed using lithography and etching techniques. The via openings VO may be formed prior to the trench openings TR1 and TR2. For example, a via-first approach includes at least the following steps. A photoresist (not shown) is applied and patterned on the dielectric material 140'. The photoresist may be a single-layer photoresist, a bi-layer photoresist, a tri-layer photoresist, or the like. The via openings VO are then formed at the predetermined locations corresponding to the through holes TH of the patterned conductive pads 130 using the photoresist as a mask. For example, portions of the dielectric material 140' and the underlying passivation layer 126' are removed through the patterned photoresist until the interconnecting layer(s) 122 is exposed. In some embodiments, a selective etching process is employed to etch the dielectric material 140' and the underlying passivation layer 126', and the etching process may continue until the top interconnecting layer Mt is exposed. Subsequently, the patterned photoresist is removed, for example, by stripping and/or ashing optionally followed by cleaning. An additional photoresist may be formed and patterned, the trench openings TR1 and TR2 are then formed by further etching the dielectric material 140' through the additional patterned photoresist. In some embodiments, the etching process is performed such that the trench openings TR1 and TR2 extend from the top portions of the dielectric material 140' to an intermediate point of the dielectric material 140' using, for example, a time-mode. Other detection techniques for etching may be contemplated. In some other embodiments, a trench-first approach (e.g., the trench openings TR1 and TR2 are formed prior to the via openings VO) is performed. Alternatively, the via openings VO and the trench openings TR1 and TR2 are formed during the same process using such as half tone mask, multi-tone mask, etc. It should be appreciated that etch stop layer(s) (not shown) may be disposed in the interconnect structure 120 or may be disposed between the dielectric material 140' and the interconnect structure 120 depending on the process requirements.

Continue to FIG. 1D, in some embodiments, the trench openings TR1 may not correspond to any of via openings in a cross section. For example, the trench TR1 may be used for forming conductive lines or dummy pads. Alternatively, the via openings VO are formed corresponding to the trench openings TR1 and TR2. The trench openings TR1 may be formed in unoccupied top portions of the dielectric material 140' so that the spacing of the trench openings TR2 may be maintained. In some embodiments, the trench openings TR2 are surrounded by the trench openings TR1. The trench openings TR1 and TR2 may be tapered from the top to the bottom. The dimensions of the trench openings TR1 may be substantially equal to those of the trench openings TR2. In some embodiments, the via openings VO may also be tapered from the top to the bottom. For example, each of trench openings TR1 and TR2 includes a top width (or diameter) WT1 greater than a bottom width WT2 thereof. The bottom widths WT2 of trench openings TR2 and top widths WV1 of the corresponding via openings VO may be located at the same plane and overlap. For example, the bottom widths WT2 of trench openings TR2 are slightly greater than the top widths WV1 of the corresponding via openings VO. The top width WV1 of each of the via openings VO may be greater than a bottom width WV2 thereof. In some embodiments, the top width WV1 of one of the via openings VO is substantially equal to or greater than about 1.8 µm. In some embodiments, a width WV3 of the each of the via openings VO at a plane where the top surface 130t of the patterned conductive pad 130 is less than the top width WH1 of the through hole TH of the patterned conductive pad 130. The bottom width WH2 of the through hole TH of the patterned conductive pad 130 is greater than a width WV4 of the each of the via openings VO at a plane where the top surface of the patterned passivation layer 126 is located. The dimensions of the through holes TH, the via openings VO, and the trench openings TR1 and TR2 may be sized depending on the functions of the subsequently formed connectors and the process requirements. Alternatively, the patterned dielectric layer 140 includes substantially vertical sidewalls at the locations where the trench openings TR1 and TR2 and/or the via openings VO are formed.

After forming the via openings VO and the trench openings TR1 and TR2, a portion of the dielectric material 140' is remained in the through holes TH of the patterned conductive pad 130 and covers the inner sidewalls 130b of the patterned conductive pad 130. The portion of the dielectric material 140' remained in the through holes TH may also cover part of the top surface of the patterned passivation layer 126 corresponding to the through holes TH. In some embodiments, the patterned conductive pad 130 disposed on the top surface of the patterned passivation layer 126 is encapsulated by the patterned dielectric layer 140.

Figure 1E:
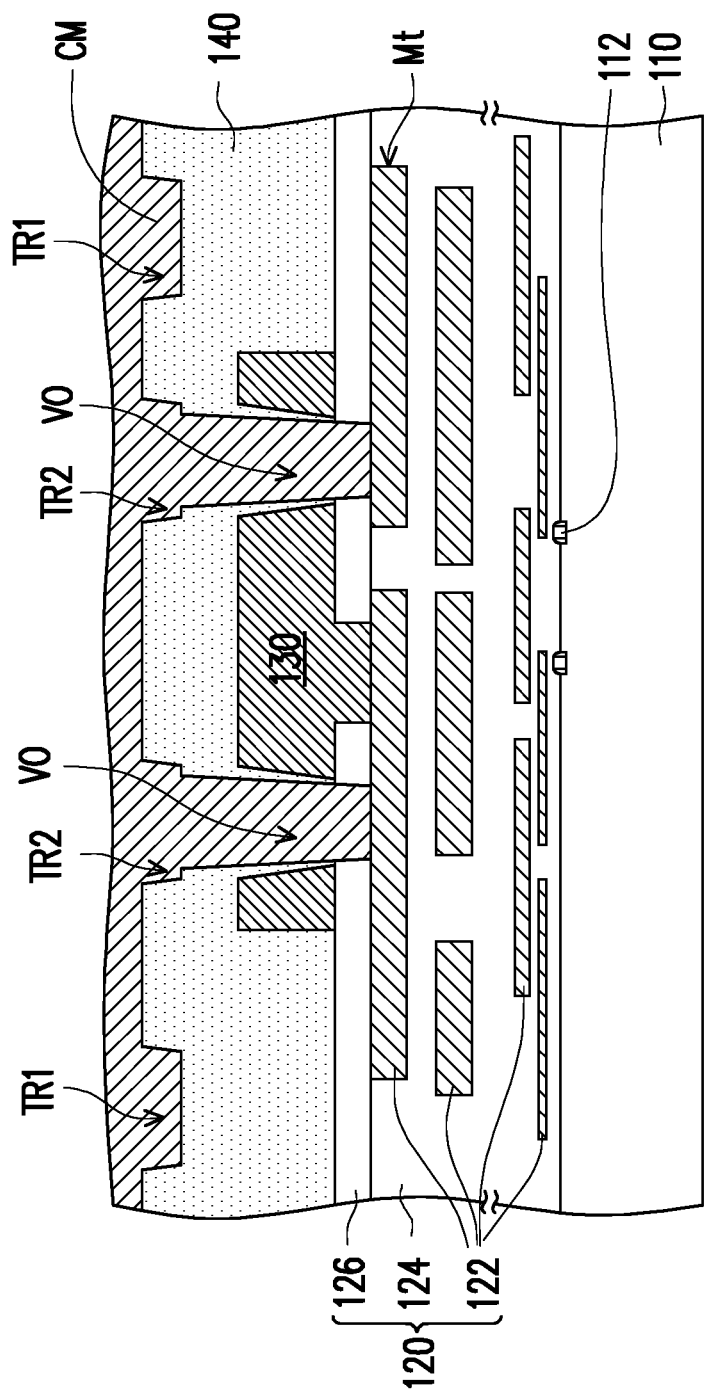
Figure 1F:
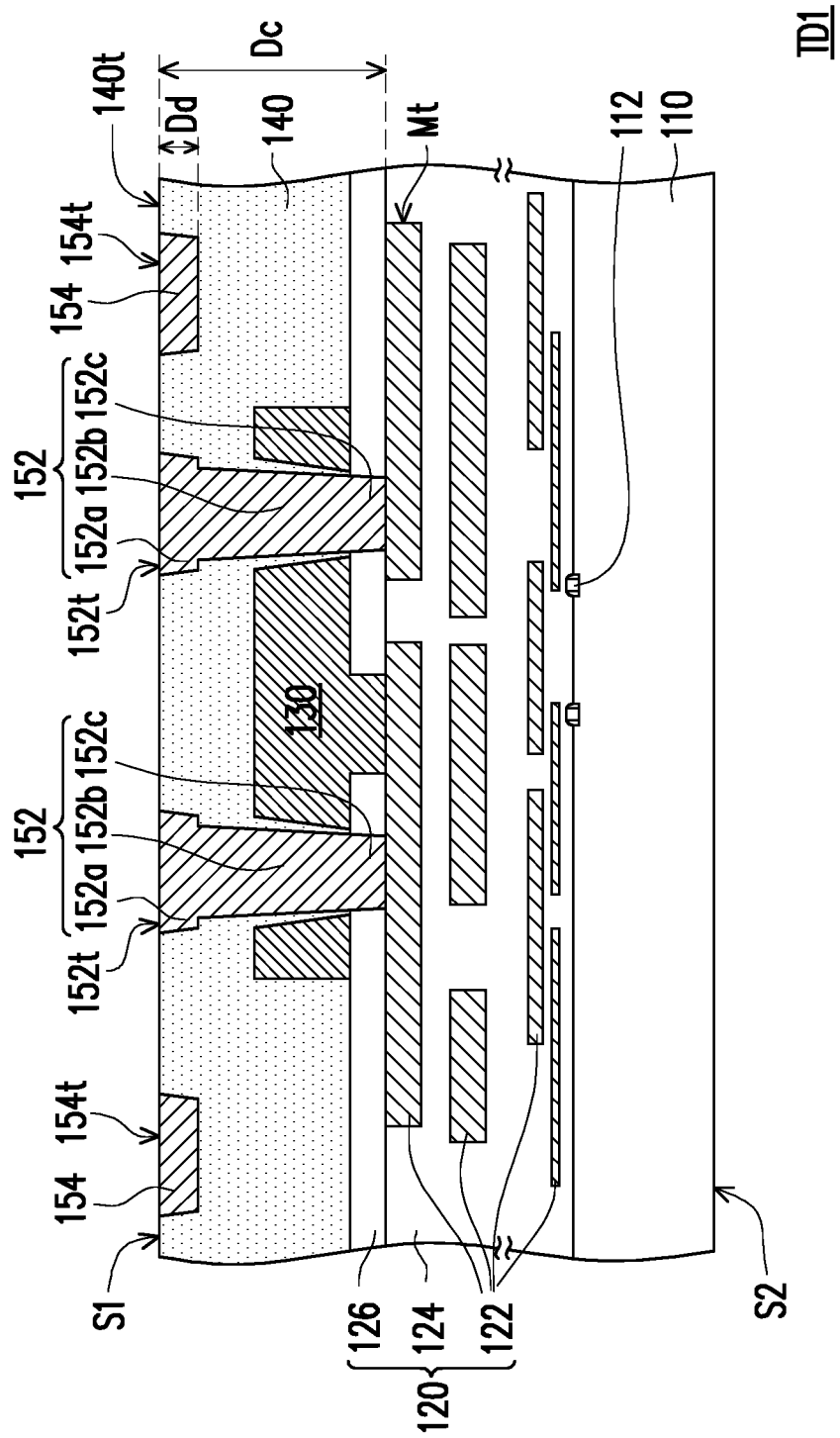

Referring to FIG. 1E and FIG. 1F, conductive materials CM are formed in the via openings VO and the trench openings TR1 and TR2 to form a plurality of conductive connectors 152 and dummy connectors 154. For example, the conductive materials CM formed in the trench openings TR1 may be viewed as the dummy connectors 154, and the conductive materials CM formed in the via openings VO and the corresponding trench openings TR2 may be viewed as the conductive connectors 152. It should be noted that the conductive connectors and the dummy connectors illustrated herein are merely exemplary. For example, the conductive connectors 152 and the dummy connectors 154 are formed as multi-layered structures.

In an exemplary embodiment, the method of forming the conductive connectors 152 and the dummy connectors 154 includes at least the following steps. For example, a diffusion barrier layer (not shown) is conformally formed on the patterned dielectric layer 140 and covers sidewalls and bottoms of the via openings VO and the trench openings TR1 and TR2. The diffusion barrier layer may be in physical and electrical contact with the interconnecting layers 122 (e.g., top interconnecting layer Mt) exposed by the via openings VO and the corresponding trench openings TR2. For example, the diffusion barrier layer includes barrier materials (e.g., titanium, titanium nitride, tantalum, tantalum nitride, and combinations thereof), and may be formed using such as physical vapor deposition (PVD) or other suitable deposition process. Next, a seed layer (not shown) may be conformally formed on the diffusion barrier layer using sputtering, plating, or other suitable depositing process. The seed layer may be or may include a copper layer, a titanium/copper bilayer, or other suitable metal layer that aids in the formation of a thicker conductive material during subsequent processing steps. Subsequently, a conductive material (e.g., copper, aluminum, silver, gold, metal alloy, etc.) is formed on the seed layer and inside the via openings VO and the trench openings TR1 and TR2 using plating, printing, or other suitable depositing process.

Afterwards, excess conductive materials CM may be removed until the underlying patterned dielectric layer 140 is exposed, such that the conductive connectors 152 and the dummy connectors 154 are formed. For example, a planarization process, such as a chemical mechanical polish (CMP) process or other suitable process, is performed on excess conductive materials CM to form a planar surface. In some embodiments, top surfaces 152t of the conductive connectors 152 and top surfaces 154t of the dummy connectors 154 are substantially leveled. It should be noted that the conductive connectors 152 and the dummy connectors 154 may be formed using other suitable techniques. Up to here, a tier TD1 of a semiconductor structure is substantially formed. In some embodiments, the tier TD1 of a semiconductor structure is viewed as a semiconductor die or a semiconductor chip. For example, the foregoing manufacturing steps of the tier TD1 are performed at a wafer level, and the tier TD1 may be or may not be singulated into a plurality of semiconductor dies (or chips) before undergoing the next step (e.g., bonding).

Still referring to FIG. 1F, the tier TD1 includes a first surface S1 and a second surface S2 opposite to the first surface S1. In some embodiments, the top surfaces 152t of the conductive connectors 152, the top surfaces 154t of the dummy connectors 154, and the top surface 140t of the patterned dielectric layer 140 are substantially leveled at the first surface S1. In some embodiments, the depths Dd of the dummy connectors 154 in the patterned dielectric layer 140 is less than the depths Dc of the conductive connectors 152 in the patterned dielectric layer 140 and the patterned passivation layer 126. The dummy connectors 154 of the tier TD1 are disposed aside the conductive connectors 152 and embedded in the patterned dielectric layer 140. The dummy connectors 154 may not be in contact with any of the underlying conductive features in a cross section as shown in FIG. 1F. For example, the dummy connectors 154 may not have electrical functions, and may be electrically floating. In some embodiments, during the use of the tier TD1, electrical signals may be connected to the semiconductor devices 112 through the interconnecting layers 122 of the interconnect structure 120 and the conductive connectors 152. However, no electrical signal or voltage may be connected to the dummy connectors 154. In some embodiments, the dummy connectors 154 are distributed at the periphery of the first surface S1, and the conductive connectors 152 may be surrounded by the dummy connectors 154. In some embodiments, with the formation of the dummy connectors 154, the pattern densities in the tier TD1 become more uniform, and hence the pattern-loading effect in the formation of the conductive connectors 152 is reduced.

In some embodiments, each of the conductive connectors 152 includes a trench portion (or pad portion) 152a, a via portion 152b extending downwardly from the corresponding trench portion 152a, and a bottom portion 152c extending from the corresponding via portion to be in contact with the interconnecting layers 122 (e.g., top interconnecting layer Mt). The trench portions 152a and the via portions 152b are laterally covered by the patterned dielectric layer 140, and the bottom portions 152c of the conductive connectors 152 are laterally covered by the patterned passivation layer 126. For example, the trench portions 152a of the conductive connectors 152 are the part of conductive materials correspondingly formed in the trench openings TR2, and the via portions 152b and the bottom portions 152c of the conductive connectors 152 are the conductive materials formed in the via openings VO. In some embodiments, the via portions 152b and the corresponding bottom portions 152c of the conductive connectors 152 are tapered from the corresponding trench portions 152a of the conductive connectors 152 to the top interconnecting layer Mt. The dimensions of the trench portions 152a, the via portions 152b, and the bottom portions 152c may be sized depending on the corresponding via openings VO and the trench openings TR2. In some embodiments, a portion of the via portions 152b of the conductive connectors 152 corresponds to the through holes TH of the patterned conductive pad 130 and may be laterally isolated from the patterned conductive pad 130 by the patterned dielectric layer 140. In some embodiments, the conductive connectors 152 are not directly connected to the patterned conductive pad 130. For example, the conductive connectors 152 are electrically coupled to the patterned conductive pad 130 through the interconnecting layers 122 (e.g., top interconnecting layer Mt). In some embodiments, the patterned conductive pad 130 is formed by the test pad. Since placing the test pads takes away the real-estate on the surface of the semiconductor die, forming the patterned conductive pad 130 by the test pads and forming the conductive connectors 152 passing through the through holes TH of the patterned conductive pad 130 to reach the interconnecting layers 122 may minimize the impact of the test pads occupying the real-estate of the surface of semiconductor die.

Figure 2A:
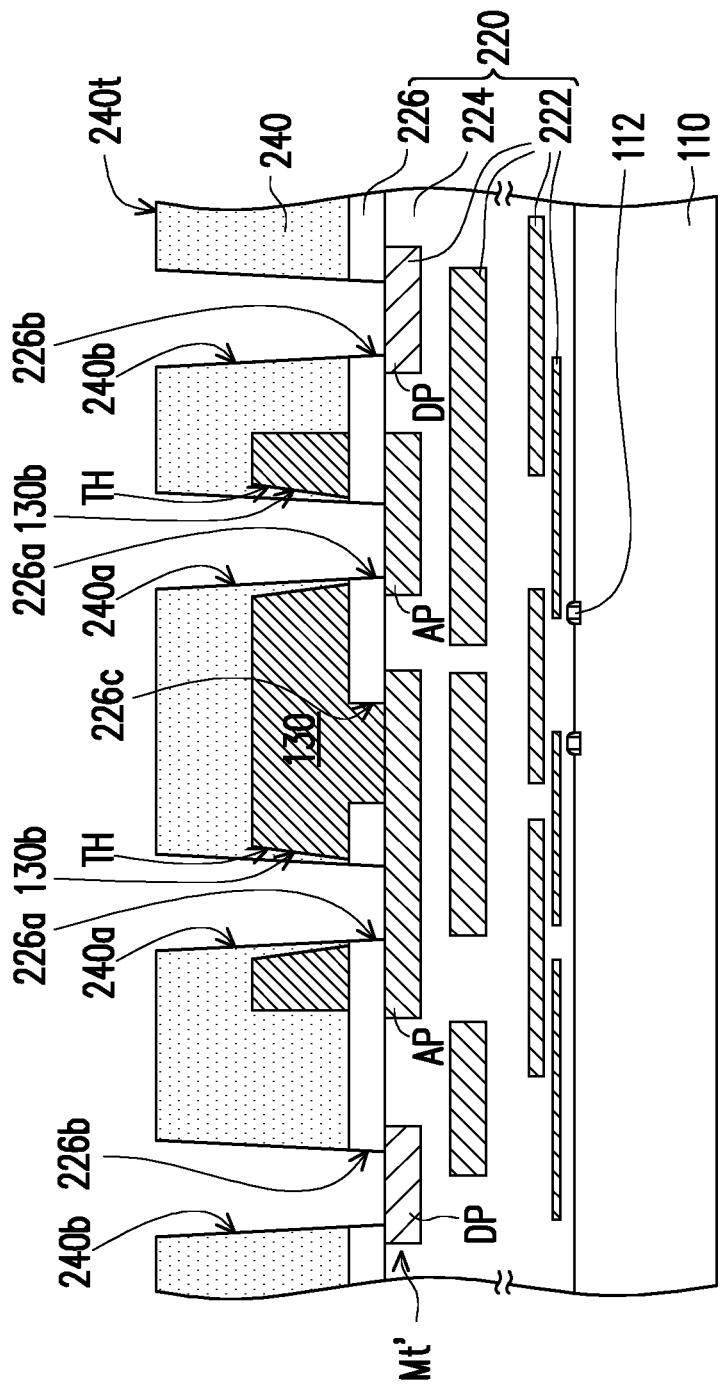
FIG. 2A and FIG. 2B are schematic cross-sectional views showing various stages in a manufacturing method of a tier of a semiconductor structure according to some exemplary embodiments of the present disclosure.
Figure 2B:
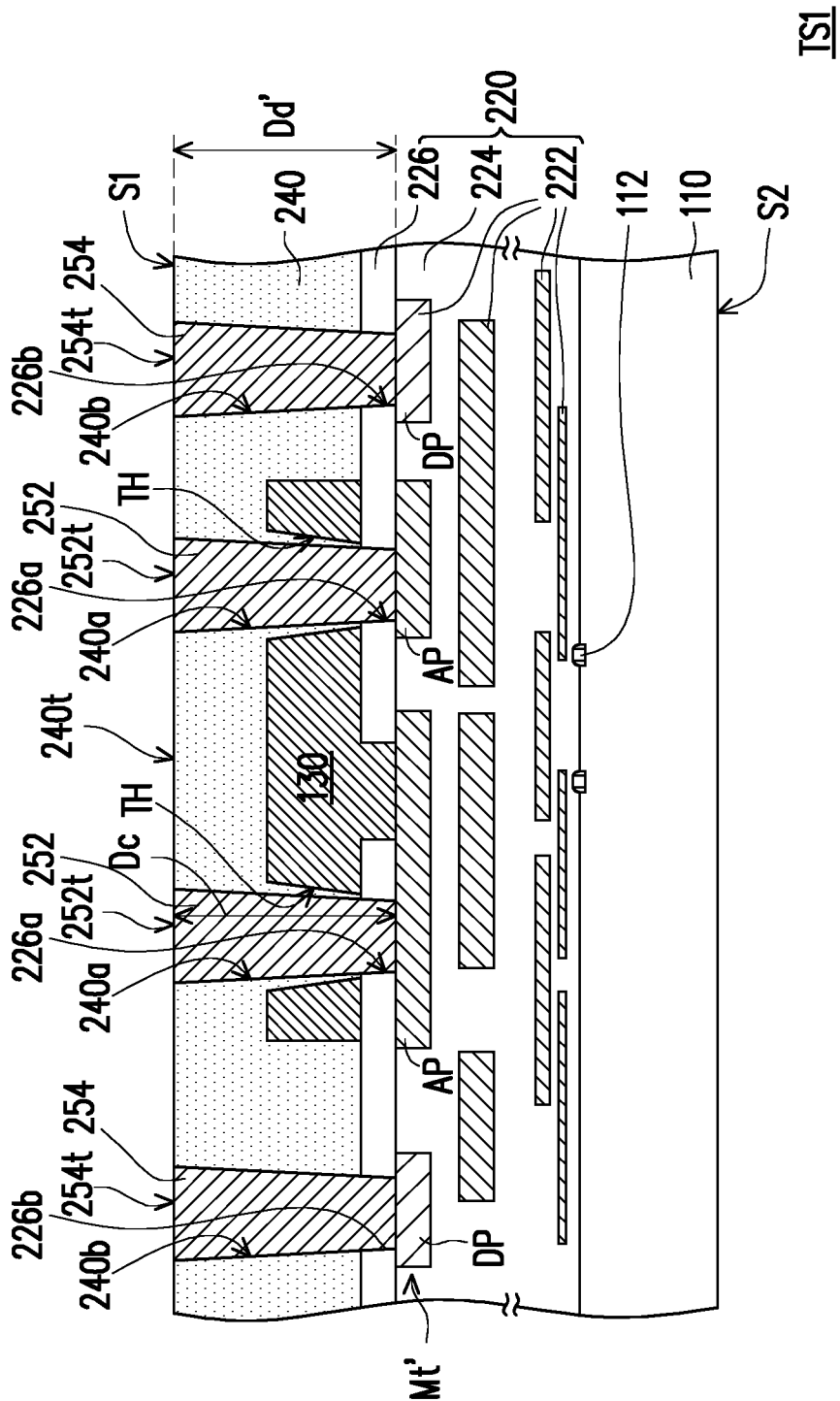

FIG. 2A and FIG. 2B are schematic cross-sectional views showing various stages in a manufacturing method of a tier of a semiconductor structure according to some exemplary embodiments of the present disclosure. The manufacturing method of the illustrated embodiment is similar to the manufacturing method of the tier TD1 described in FIG. 1A to FIG. 1F, and like elements throughout the drawings are designated with the same reference numbers for ease of understanding and the details thereof are not repeated herein. Referring to FIG. 2A, an interconnect structure 220 is formed on the semiconductor substrate 110. For example, the interconnect structure 220 includes at least one dielectric layer 224 disposed on the semiconductor substrate 110, and a plurality of interconnecting layers 222 embedded in the dielectric layers 224. The interconnecting layers 222 may be electrically coupled to the semiconductor devices 112 of the semiconductor substrate 110 to one another and to external components. The interconnecting layers 222 and the dielectric layers 224 may be similar to the interconnecting layers 122 and the dielectric layers 124 described in FIG. 1A, except that the interconnecting layers 222 of the interconnect structure 220 include a dummy pattern DP. In some embodiments, the dummy pattern DP of the interconnect structure 220 is electrically floating. In other embodiments, the dummy pattern DP is electrically coupled to some functional semiconductor devices 112 or provides short grounding paths for grounding the integrated circuits. For example, the dummy pattern DP is formed in the top interconnecting layer Mt' of the interconnecting layers 222. It should be noted that the dummy pattern DP may be formed in, or not in, any level(s) of the interconnecting layers 222 depending on the design requirements. In some embodiments, the conductive pattern other than the dummy pattern DP may be viewed as active pattern AP. For example, the active pattern AP formed in the top interconnecting layer Mt' may be surrounded by the dummy pattern DP of the top interconnecting layer Mt'. It should be noted that the illustrated configuration of the dummy pattern DP and the active pattern AP is merely exemplary, other configuration(s) may be possible.

Continue to FIG. 2A, the patterned passivation layer 226 of the interconnect structure 220 is formed on the topmost one of the dielectric layers 224 and partially covers top interconnecting layer Mt'. In some embodiments, the patterned passivation layer 226 includes a plurality of first openings 226a, second openings 226b, and third openings 226c. For example, the first openings 226a and the third openings 226c respectively expose at least portions of the active pattern AP, and the second openings 226b expose at least a portion of the dummy pattern DP. The patterned conductive pad 130 is disposed on the top surface of the patterned passivation layer 226 and inside the third openings 226c of the patterned passivation layer 226 to be electrically coupled to the interconnect structure 220. For example, the patterned conductive pad 130 is electrically coupled to the active pattern AP of the interconnecting layers 222. The first openings 226a of the patterned passivation layer 226 may correspond to the through holes TH of the patterned conductive pad 130. For example, a bottom width of one of through holes TH is greater than or substantially equal to a top width of the corresponding first opening 226a of the patterned passivation layer 226.

A patterned dielectric layer 240 covers the patterned conductive pad 130 and the interconnect structure 220. For example, the patterned dielectric layer 240 is formed on the patterned passivation layer 226 and encapsulates the patterned conductive pad 130. In some embodiments, a portion of the patterned dielectric layer 240 extends through the through holes TH of the patterned conductive pad 130 and covers the inner sidewalls 130b of the patterned conductive pad 130. For example, the patterned dielectric layer 240 includes a plurality of first openings 240a and second openings 240b. The first openings 240a of the patterned dielectric layer 240 correspond to the through holes TH of the patterned conductive pad 130, and may be in communication with the first openings 226a of the patterned passivation layer 226. The second openings 240b of the patterned dielectric layer 240 are disposed aside the first openings 240a, and may be in communication with the second openings 226b of the patterned passivation layer 226. In some embodiments, at least a portion of the dummy pattern DP of the top interconnecting layer Mt' is exposed by the second openings 226b of the patterned passivation layer 226 and the second openings 240b of the patterned dielectric layer 240.

Still referring to FIG. 2A, the forming methods of the patterned passivation layer 226, the patterned conductive pad 130, and the patterned dielectric layer 240 may include at least the following steps. For example, the passivation material is formed on the top interconnecting layer Mt' and the topmost one of the dielectric layers 224, and then the passivation material is patterned to form the third openings 226c. Alternatively, the first openings 226a and/or the second openings 226b may be formed together with the third openings 226c to form the patterned passivation layer 226. The passivation material may be similar to the material of the patterned passivation layer 126 described above. Next, a conductive material is formed on the top surface of the passivation material and inside the third openings 226c, and then the conductive material is patterned to form the patterned conductive pad 130 with the through holes TH. Next, the dielectric material may be formed on the passivation material to cover the patterned conductive pad 130 and to fill the through holes TH. The dielectric material may be similar to the material of the patterned dielectric layer 140. In certain embodiments in which the second openings 226b and/or the first openings 226a are formed together with the third openings 226c, the dielectric material may be formed in the first openings 226a and the second openings 226b of the patterned passivation layer 226. Subsequently, the dielectric material may be patterned to form the patterned dielectric layer 240 with the first openings 240a and the second openings 240b using, for example, a damascene process. The underlying passivation material may be patterned during the same process to form the patterned passivation layer 226

In some embodiments, the first openings 240a and the second openings 240b of the patterned dielectric layer 240 are tapered from a top surface 240t of the patterned dielectric layer 240 towards the top interconnecting layer Mt'. For example, a width of each of first openings 240a and the second openings 240b gradually increases in a direction towards the top surface 240t of the patterned dielectric layer 240, thereby creating sloped inner sidewalls of the patterned dielectric layer 240. It should be appreciated that the single damascene technique described in conjunction with FIG. 2A is merely exemplary, and a dual damascene process or other suitable patterning process may be used in other embodiments. It is also noted that the forming methods of the patterned passivation layer 226, the patterned conductive pad 130, and the patterned dielectric layer 240 can be performed in any logical order which are not limited in the disclosure.

Referring to FIG. 2B, conductive materials are formed in the patterned passivation layer 226 and the patterned dielectric layer 240 to form conductive connectors 252 and dummy connectors 254. In an embodiment, the conductive materials may be formed by depositing one or more diffusion barrier layer(s) on the inner sidewalls of the patterned dielectric layer 240, and on the inner sidewalls and the bottom of the patterned passivation layer 226 so as to be in contact with the interconnecting layers 222 (e.g., top interconnecting layer Mt'), and then depositing a seed layer. Once the seed layer has been deposited in the patterned dielectric layer 240 and the patterned passivation layer 226, a conductive material is filled into the first openings 240a and the second openings 240b of the patterned dielectric layer 240 and the first openings 226a and the second openings 226b of the patterned passivation layer 226. Excess conductive materials and/or dielectric films may be removed from the top surface 240t of the patterned dielectric layer 240. The filled first openings 240a and 226a form the conductive connectors 252, and the filled second openings 240b and 226b form the dummy connectors 254. Up to here, a tier TS1 of a semiconductor structure is substantially formed.

Continue to FIG. 2B, the tier TS1 includes a first surface S1 and a second surface S2 opposite to the first surface S1. The top surfaces 254t of the dummy connectors 254, the top surfaces 252t of the conductive connectors 252, and the top surface 240t of the patterned dielectric layer 240 may be substantially leveled at the first surface S1 of the tier TS1. In some embodiments, the depth Dd' of one of the dummy connectors 254 in the patterned dielectric layer 240 and the patterned passivation layer 226 is substantially equal to the depth Dc of one of the conductive connectors 252 in the patterned dielectric layer 240 and the patterned passivation layer 226. In some embodiments, all of the conductive connectors 252 and the dummy connectors 254 of the tier TS1 penetrate through the patterned dielectric layer 240 and the patterned passivation layer 226. Alternatively, the dummy connectors 254 may be inlaid with the patterned dielectric layer 240 and may not pass through the patterned dielectric layer 240. In some embodiments, the conductive connectors 252 are surrounded by the dummy connectors 254. In some embodiments, the conductive connectors 252 of the tier TS1 pass through the portion of the patterned dielectric layer 240 extending into the through holes TH of patterned conductive pad 130 so as to be in physical and electrical contact with the active pattern AP (e.g., located at the top interconnecting layer Mt' or other level(s) of the interconnecting layers 222) of the interconnect structure 220. The conductive connectors 252 may be electrically coupled to the patterned conductive pad 130 through the active pattern AP of the interconnect structure 220. In some embodiments, the dummy connectors 254 of the tier TS1 pass through the patterned dielectric layer 240 and the patterned passivation layer 226 to be in contact with the dummy pattern DP (e.g., located at the top interconnecting layer Mt' or other level(s) of the interconnecting layers 222) of the interconnect structure 220.

The dummy connectors 254 and the dummy pattern DP of the interconnect structure may not have electrical functions, and may be electrically floating in the tier TS1. In subsequent steps, the tier TS1 may be sawed into semiconductor dies. During the use of the semiconductor dies, electrical signals may be connected to the active pattern AP and the conductive connectors 252, but no electrical signal or voltage may be connected to dummy connectors 254 and the dummy pattern DP. In some embodiments, a conductive path may be found between the dummy connectors 254 and the dummy pattern DP, although both of them may be floating. In some embodiments, the dummy connectors 254 and the dummy pattern DP are used for thermal dissipation. In other embodiments, the dummy connectors 254 and the dummy pattern DP are used to provide short grounding paths for grounding the integrated circuits of the tier TS1.

Figure 3A:
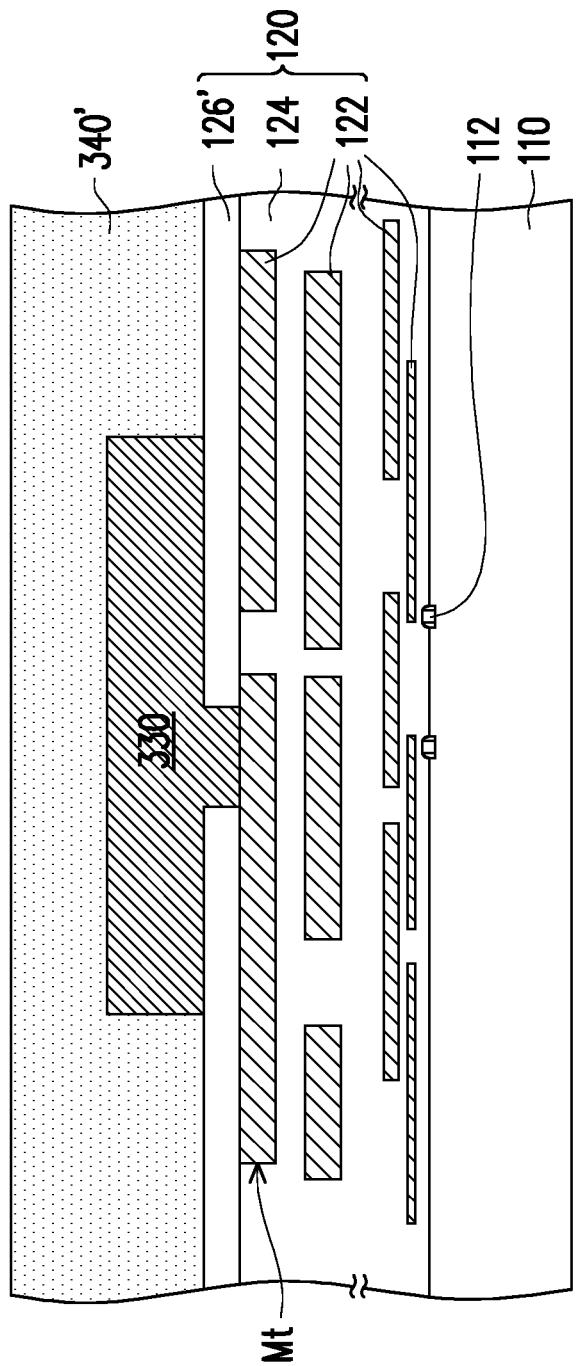
FIG. 3A to FIG. 3C are schematic cross-sectional views showing various stages in a manufacturing method of a tier of a semiconductor structure according to some exemplary embodiments of the present disclosure.
Figure 3B:
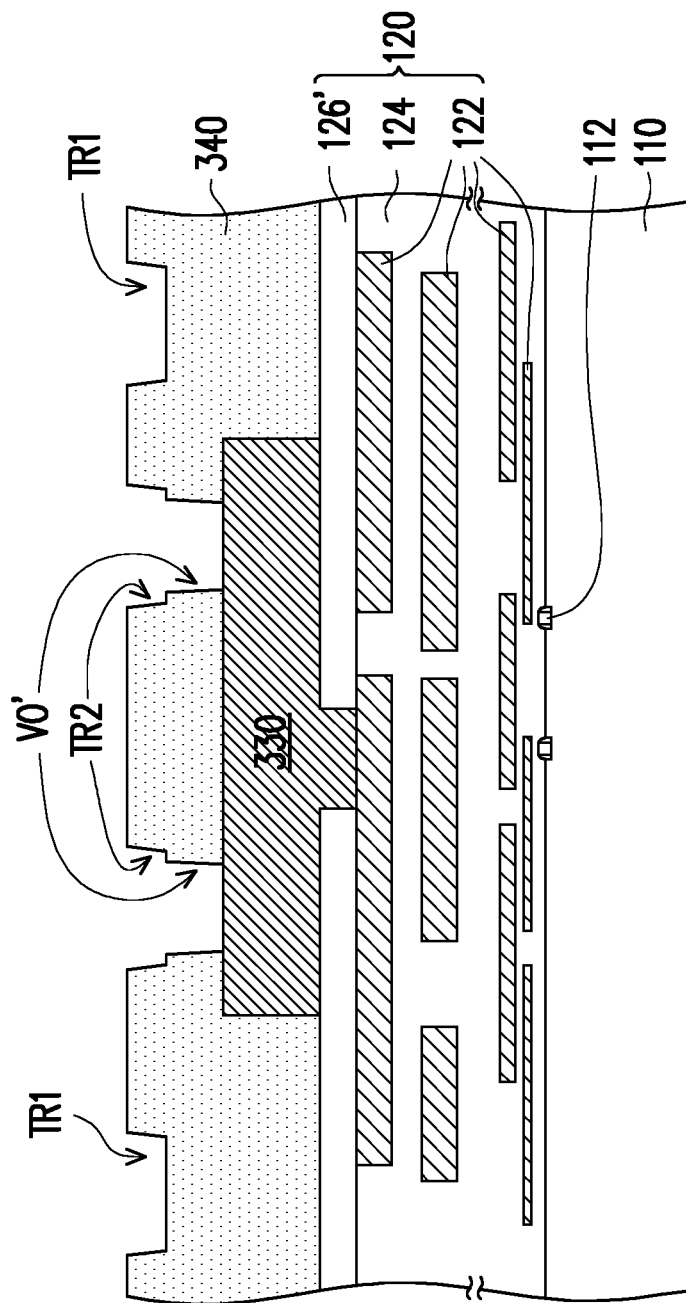
Figure 3C:
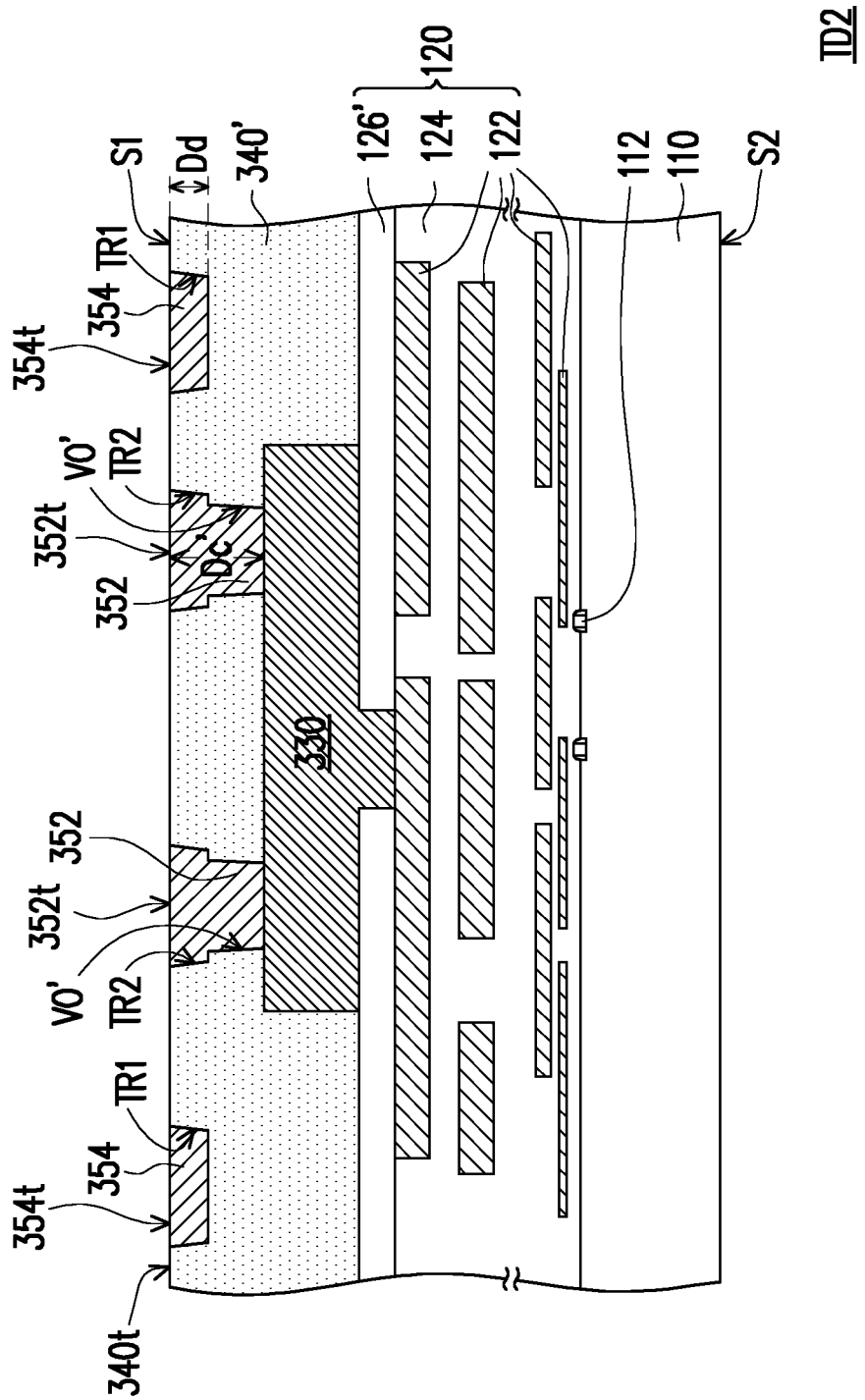

FIG. 3A to FIG. 3C are schematic cross-sectional views showing various stages in a manufacturing method of a tier of a semiconductor structure according to some exemplary embodiments of the present disclosure. The manufacturing method of the illustrated embodiment is similar to the manufacturing method of the tier TD1 described in FIG. 1A to FIG. 1F, and like elements throughout the drawings are designated with the same reference numbers for ease of understanding and the details thereof are not repeated herein. Referring to FIG. 3A, a dielectric material 340' is formed on the passivation layer 126' of the interconnect structure 120 over the semiconductor substrate 110 to encapsulate the conductive pad 330. For example, a conductive material is formed on the passivation layer 126' and inside the openings of the passivation layer 126' to be in physical and electrical contact with the top interconnecting layer Mt, and then the conductive material is patterned to form the conductive pad 330. The conductive pad 330 is electrically coupled to the semiconductor devices 112 through the interconnecting layers 122 of the interconnect structure 120. In the illustrated embodiment, the conductive pad 330 is not patterned to form through holes. After forming the conductive pad 330, the dielectric material 340' is formed on the passivation layer 126' to cover the conductive pad 330 using a deposition process or other suitable techniques. The materials of the conductive pad 330 and the dielectric material 340' may be similar to those of the conductive pad 130' and the dielectric material 140', respectively.

Referring to FIG. 3B, a portion of the dielectric material 340' is removed to form a patterned dielectric layer 340. In some embodiments, a dual damascene process is performed on the dielectric material 340' to form the patterned dielectric layer 340 with a plurality of trench openings TR1 and TR2 and a plurality of via openings VO' extend from the bottoms of the trench openings TR2. The via openings VO' and the trench openings TR1 and TR2 may be formed by several approaches, such as via-first approach, trench-first approach, and others suitable patterning techniques. The trench openings TR2 may correspond to the conductive pad 330, and may be surrounded by the trench openings TR1. In other embodiments, the trench openings TR1 are omitted. Each of the trench openings TR2 may be in communication with one of the via openings VO'. The opening depth of one of the trench openings TR1 may be less than the total opening depth of one of the trench openings TR2 and the corresponding via opening VO'. In some embodiments, at least a portion of the conductive pad 330 is accessibly exposed by the trench openings TR2 and the corresponding via openings VO' for further electrical connection. It should be noted that two sets of trench openings TR2 and the via openings VO' illustrated in FIG. 3B are merely exemplary, more sets or only one set of trench openings TR2 and the via openings VO' may be possible.

Referring to FIG. 3C, conductive materials may be formed in the via openings VO' and the trench openings TR1 and TR2 to form a plurality of conductive connectors 352 and dummy connectors 354. For example, the conductive materials formed in the trench openings TR1 may be viewed as the dummy connectors 354, and the conductive materials formed in the trench openings TR2 and the via openings VO' and landing on the conductive pad 330 may be viewed as the conductive connectors 352. The conductive connectors 352 are in physical and electrical contact with the underlying conductive pad 330. It should be noted that the conductive connectors 352 and the dummy connectors 354 illustrated herein are merely exemplary, and the conductive connectors 352 and the dummy connectors 354 may be formed as multi-layered structures including diffusion barrier layer, seed layer, and plated metal layer, etc. The forming process of conductive connectors 352 and dummy connectors 354 may be similar to that of the conductive connectors 152 and dummy connectors 154 described in FIG. 1E and FIG. 1F, and the detailed descriptions are omitted for brevity. Up to here, a tier TD2 of a semiconductor structure is substantially formed.

Continue to FIG. 3C, the tier TD2 includes a first surface S1 and a second surface S2 opposite to the first surface S1. In some embodiments, the top surfaces 352t of the conductive connectors 352, the top surfaces 354t of the dummy connectors 354, and the top surface 340t of the patterned dielectric layer 340 are substantially leveled at the first surface S1. In some embodiments, the depth Dd of one of the dummy connectors 354 in the patterned dielectric layer 340 is less than the depth Dc' of one of the conductive connectors 352 in the patterned dielectric layer 340. Alternatively, the depth Dd of one of the dummy connectors 354 may be substantially equal to or greater than the depth Dc' of one of the conductive connectors 352 in other embodiments. The conductive connectors 352 laterally covered by the patterned dielectric layer 340 may be electrically coupled to the interconnecting layers 122 through the conductive pad 330. The dummy connectors 354 disposed aside the conductive connectors 352 and embedded in the patterned dielectric layer 340 may not have electrical functions, and may be electrically floating. In some embodiments, during the use of the tier TD2, electrical signals may be connected to semiconductor devices 112 through the interconnecting layers 122, the conductive pad 330, and the conductive connectors 352. However, no electrical signal or voltage may be connected to the dummy connectors 354. In some embodiments, with the formation of the dummy connectors 354, the pattern densities in the tier TD2 become more uniform, and hence the pattern-loading effect in the formation of the conductive connectors 352 is reduced.

Figure 4A:
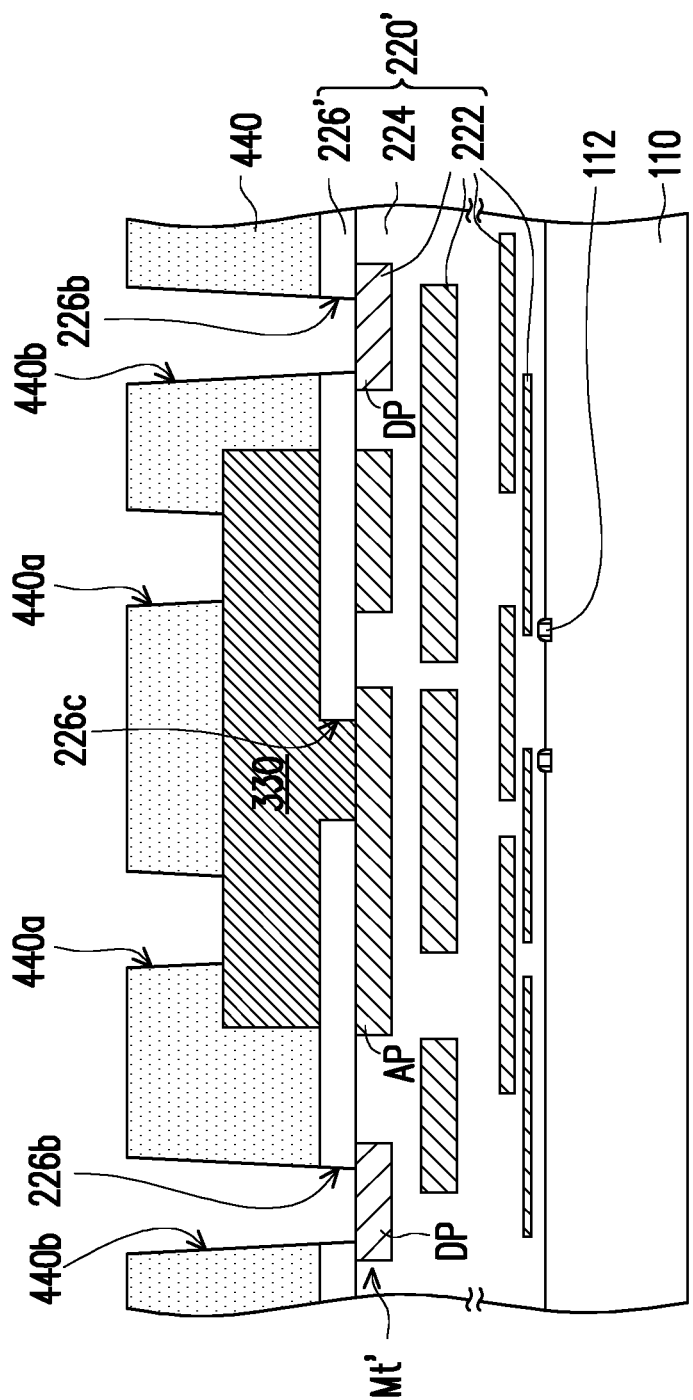
FIG. 4A and FIG. 4B are schematic cross-sectional views showing various stages in a manufacturing method of a tier of a semiconductor structure according to some exemplary embodiments of the present disclosure.
Figure 4B:
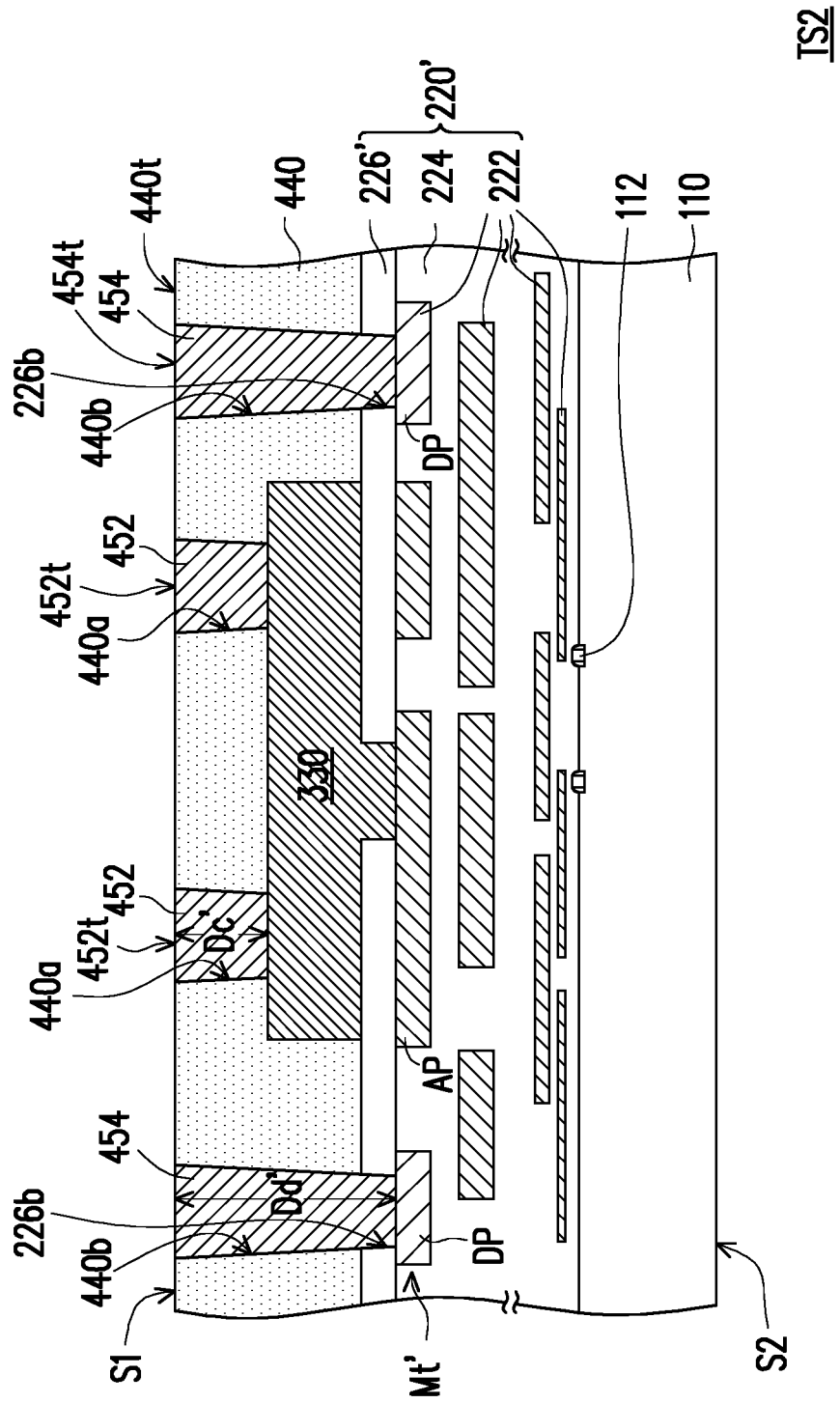

FIG. 4A and FIG. 4B are schematic cross-sectional views showing various stages in a manufacturing method of a tier of a semiconductor structure according to some exemplary embodiments of the present disclosure. The manufacturing method of the illustrated embodiment is similar to the manufacturing methods of the tier TS1 and tier TD2 respectively described in FIG. 2A to FIG. 2B and FIG. 3A to FIG. 3C. Like elements throughout the drawings are designated with the same reference numbers for ease of understanding and the details thereof are not repeated herein. Referring to FIG. 4A, an interconnect structure 220' is formed on the semiconductor substrate 110. For example, the interconnect structure 220' includes at least one dielectric layer 224 disposed on the semiconductor substrate 110, a plurality of interconnecting layers 222 embedded in the dielectric layers 224 and electrically coupled to the semiconductor devices 112, and a patterned passivation layer 226' formed on the topmost one of the dielectric layers 224 and partially exposing the top interconnecting layer Mt'. The material and the forming process of the patterned passivation layer 226' may be similar to those of the patterned passivation layer 226 described in FIG. 2A. The difference between the patterned passivation layer 226' and the patterned passivation layer 226 described in FIG. 2A lies in that the patterned passivation layer 226' in the illustrated embodiment includes the second openings 226b and the third openings 226c, but not include the first openings 226a.

In some embodiments, at least a portion of the dummy pattern DP of the interconnecting layers 222 (e.g., the top interconnecting layer Mt') is accessibly exposed by the second openings 226b of the patterned passivation layer 226'. The third openings 226c of the patterned passivation layer 226' surrounded by the second openings 226b may accessibly expose at least a portion of the active pattern AP of the interconnecting layers 222 (e.g., the top interconnecting layer Mt') for connection of the subsequently formed conductive pad 330. The conductive pad 330 is formed on the top surface of the patterned passivation layer 226' and inside the third openings 226c of the patterned passivation layer 226'. The material of and the forming process of the conductive pad 330 is similar to those of the conductive pad 330 described in FIG. 3A, so the detailed descriptions are not repeated for brevity.

Continue to FIG. 4A, after forming the conductive pad 330, a patterned dielectric layer 440 is formed on the patterned passivation layer 226' and partially covers the conductive pad 330. The material of and the forming process of the patterned dielectric layer 440 is similar those of the patterned dielectric layer 240 described in FIG. 2A. In some embodiments, the first openings 440a of the patterned dielectric layer 440 accessibly expose at least a portion of the conductive pad 330 for further electrical connection. The second openings 440b of the patterned dielectric layer 440 may correspond to and may be in communication with the second openings 226b of the patterned passivation layer 226' so as to accessibly expose the underlying dummy pattern DP. In some embodiments, the opening depths of the second openings 440b of the patterned dielectric layer 440 are greater than the opening depths of the first openings 440a of the patterned dielectric layer 440. In some embodiments, the third openings 226c of the patterned passivation layer 226' may be formed prior to the second openings 226b of the patterned passivation layer 226', and the second openings 440b of the patterned dielectric layer 440 and the second openings 226b of the patterned passivation layer 226' are formed in the same patterning process. It should be noted that the numbers of the openings illustrated herein are merely exemplary, more openings or less openings may be possible depending on the design requirements.

Referring to FIG. 4B, conductive materials may be formed in the second openings 226b of the patterned passivation layer 226', the first openings 440a and the second openings 440b of the patterned dielectric layer 440 to form a plurality of conductive connectors 452 and dummy connectors 454. The conductive connectors 452 are in physical and electrical contact with the underlying conductive pad 330. It should be noted that the conductive connectors 452 and the dummy connectors 454 shown in FIG. 4B are for illustrative purpose, and the conductive connectors 352 and the dummy connectors 354 may be formed as multi-layered structures including diffusion barrier layer, seed layer, and plated metal layer, or the like. Up to here, a tier TS2 of a semiconductor structure is substantially formed. The tier TS2 includes a first surface S1 and a second surface S2 opposite to the first surface S1. The top surfaces 454t of the dummy connectors 454, the top surfaces 452t of the conductive connectors 452, and the top surface 440t of the patterned dielectric layer 440 may be substantially leveled at the first surface S1 of the tier TS2.

Continue to FIG. 4B, in some embodiments, the dummy connectors 454 of the tier TS2 penetrate through the patterned dielectric layer 440 and the patterned passivation layer 226' to be in physical contact with the dummy pattern DP (e.g., located at the top interconnecting layer Mt' or other level(s) of the interconnecting layers 222) of the interconnect structure 220'. Alternatively, the dummy connectors 454 may not pass through the patterned dielectric layer 440 and may not be connected to the interconnect structure 220'. In some embodiments, the conductive connectors 452 are surrounded by the dummy connectors 454, and may extend from the top surface 440t of the patterned dielectric layer to land on the conductive pad 330. The conductive connectors 452 may be electrically coupled to the interconnect structure 220' through the conductive pad 330. In some embodiments, the depth Dd' of one of the dummy connectors 454 in the patterned dielectric layer 440 and the patterned passivation layer 226' are greater than the depth Dc' of one of the conductive connectors 452 in the patterned dielectric layer 440. The dummy connectors 454 and the dummy pattern DP connected thereof may not have electrical functions, and may be electrically floating in the tier TS2. In subsequent steps, the tier TS2 may be sawed into semiconductor dies. During the use of the semiconductor dies, electrical signals may be connected to the active pattern AP, the conductive pad 330, and the conductive connectors 452, but no electrical signal or voltage may be connected to dummy connectors 454 and the dummy pattern DP. In some embodiments, a conductive path may be found between the dummy connectors 454 and the dummy pattern DP, although both of them may be floating. In other embodiments, the dummy connectors 454 and the dummy pattern DP are used to provide short grounding paths for grounding the integrated circuits of the tier TS2 and/or provide additional thermal dissipation paths.

Figure 5A:
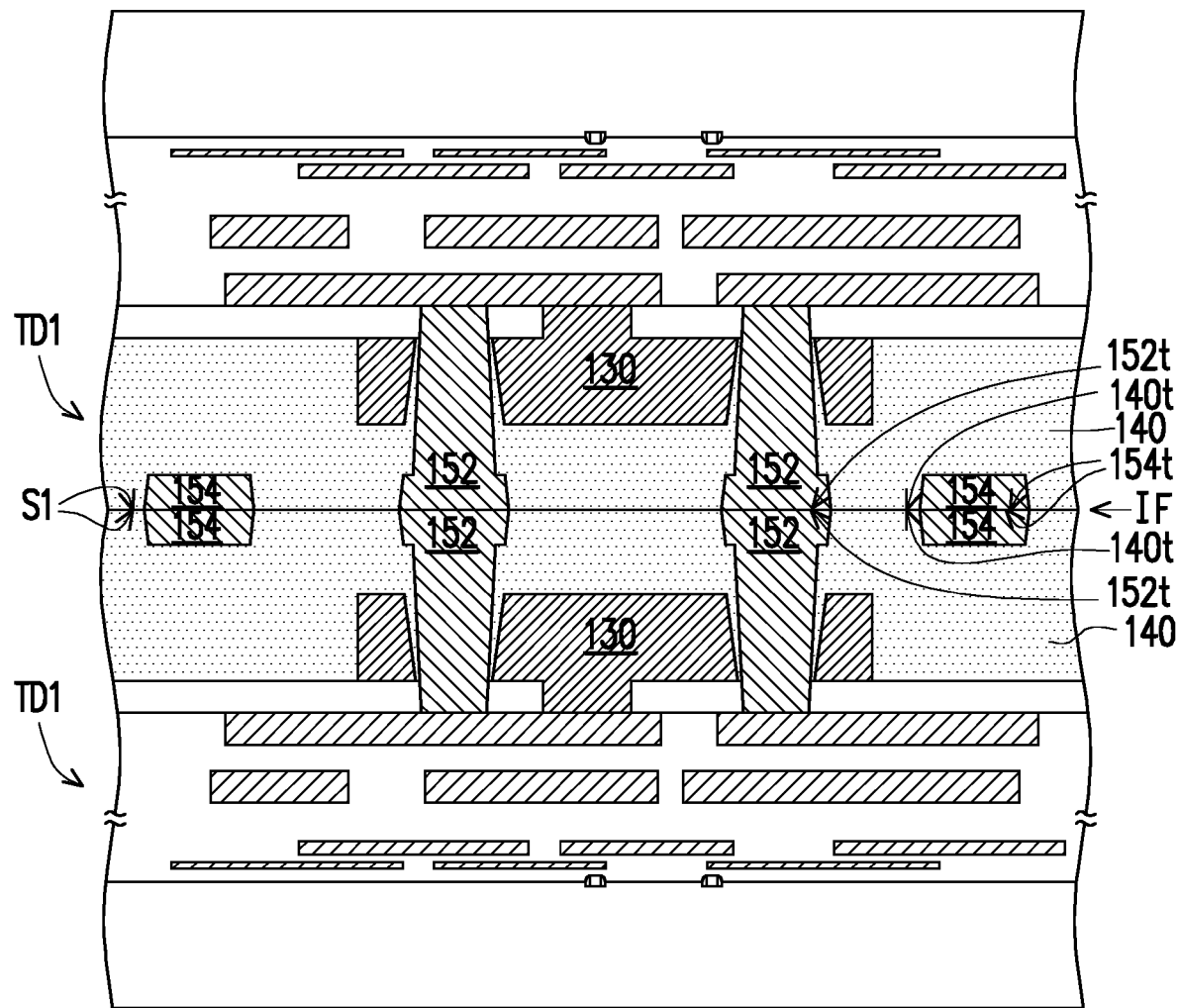
FIG. 5A and FIG. 5B are schematic cross-sectional views showing various stages in a manufacturing method of a semiconductor structure according to some exemplary embodiments of the present disclosure.
Figure 5B:
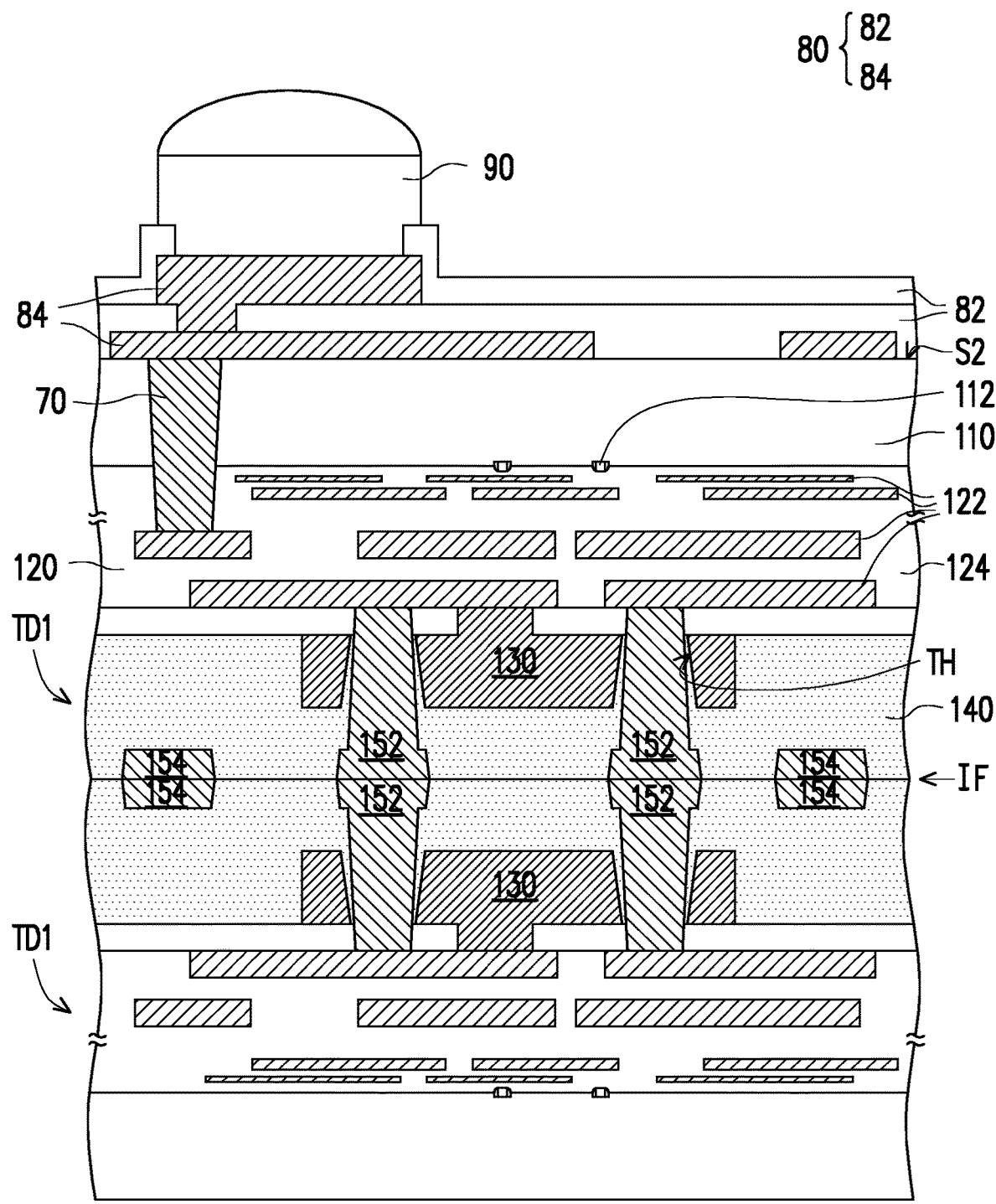

FIG. 5A and FIG. 5B are schematic cross-sectional views showing various stages in a manufacturing method of a semiconductor structure according to some exemplary embodiments of the present disclosure. Referring to FIG. 5A, two of the tiers TD1 are bonded together in a face-to-face configuration. For example, the tiers TD1 are arranged with the first surfaces S1 facing each other and are bonded. Alternatively, the tiers are arranged in a face-to-back configuration, where the first surface of one of the tiers is boned to the second surface of the other one of the tiers. In some embodiments, the tiers TD1 are fabricated separately, and a hybrid bonding process is performed on the tiers TD1. It should be noted that various bonding schemes can be used to stack the semiconductor structures, thereby forming three-dimensional integrated circuit (3DIC). For example, a bonding interface IF between the tiers TD1 includes dielectric-to-dielectric bonding (e.g., oxide-to-oxide bonding), metal-to-metal bonding (e.g., copper-to-copper bonding), metal-to-dielectric bonding (e.g., oxide-to-copper bonding), any combinations thereof, and/or the like.

In an exemplary embodiment, the hybrid bonding process of the tiers TD1 includes at least the following steps. For example, surface preparation for bonding surfaces (e.g., the first surfaces S1 of the tiers TD1) is performed to remove particles thereon. The surface preparation may include surface cleaning and activation or other suitable process. In some embodiments, the top surfaces 152t of the conductive connectors 152 and the top surfaces 154t of the dummy connectors 154 may be cleaned by wet cleaning before performing a bonding process. Not only particles are removed, but also native oxide formed on the top surfaces 152t and 154t of the conductive connectors 152 and the dummy connectors 154 of the tiers TD1 may be removed by chemicals used in the wet cleaning. After cleaning, activation of the top surfaces 140t of the patterned dielectric layers 140 of the tiers TD1 may be performed for development of high bonding strength. In some embodiments, plasma activation may be performed to treat the top surfaces 140t of the patterned dielectric layers 140. In some embodiments, the tiers TD1 are aligned with each other and sub-micron alignment precision may be achieved. Once the tiers TD1 are aligned precisely, one of the tiers TD1 is placed on and in contact with the other one of the tiers TD1. When the activated top surfaces 140t of the patterned dielectric layers 140 of the tiers TD1 are in contact with each other, the top surfaces 140t of the patterned dielectric layers 140 of the tiers TD1 are pre-bonded. In other words, the tiers TD1 are pre-bonded through the pre-bonding of the patterned dielectric layers 140. After pre-bonding, the conductive connectors 152 and the dummy connectors 154 of one of the tiers TD1 may respectively correspond to and may be in physical contact with the conductive connectors 152 and the dummy connectors 154 of the other one of the tiers TD1.

In some embodiments, after pre-bonding, a hybrid bonding of the tiers TD1 is performed. The hybrid bonding may include a treatment for dielectric bonding to strengthen the bonding between the patterned dielectric layers 140, and a thermal annealing to facilitate the bonding between the conductive connectors 152 and the dummy connectors 154 of the tiers TD1. In some embodiments, the process temperature of the thermal annealing for connectors' bonding is higher than that of the treatment for dielectric bonding. Since the thermal annealing performing onto the conductive connectors 152 and the dummy connectors 154 is performed at relative higher temperature, metal diffusion and grain growth may occur at the bonding interface IF between the conductive connectors 152 and the dummy connectors 154 of two tiers TD1. After the bonding is performed, the conductive connectors 152 of these two tiers TD1 provide vertical and electrical connections therebetween. The patterned dielectric layers 140 may function as bonding dielectric layers. The conductive connectors 152 may be referred to as bonding connectors. The dummy connectors 154 of two tiers TD1 are bonded together and may also be referred to as bonding connectors, but the dummy connectors 154 are electrically isolated from the underlying conductive features. For example, the bonded dummy connectors 154 may not have electrical functions, and may be electrically floating. Up to here, a bonded structure of two tiers TD1 is formed.

Referring to FIG. 5B, after boning, a through semiconductor via (TSV) 70 is formed in the semiconductor substrate 110 and extends into the interconnect structure 120 of at least one of the tiers TD1. The TSV 70 may extend into the dielectric layers 124 to reach any level(s) of the interconnecting layers 122 so that the TSV 70 may be electrically coupled to the semiconductor devices 112 through the interconnecting layers 122. The formation of TSV 70 may be performed before or after bonding the tiers TD1. In some embodiments, the TSV 70 is formed using a via-first approach, and is formed during the formation of the interconnect structure 120. In other embodiments, the TSV 70 is formed using a via-last approach, and may be formed after the formation of interconnect structure 120. It should be noted that the forming step of the TSV 70 can be performed in any logical order which are not limited in the disclosure. In some embodiments, the TSV 70 is tapered from the semiconductor substrate 110 towards the interconnecting layers 122. In other embodiments, the width of the TSV 70 increases in a direction towards the bonding interfaces IF. Alternatively, the sidewalls of the TSV 70 may be substantially vertical relative to the bonding interface IF. It should be noted that although only one TSV is illustrated in FIG. 5B, more TSVs may be disposed in the bonded structure to perform one or more functions. It is also noted that any number of the tiers TD1 may be stacked vertically in any combination depending on the design requirements, and different tiers may be electrically communicated to one another through at least the conductive connectors, the TSVs, and other conductive features.

Continue to FIG. 5B, a redistribution structure 80 may be formed on the semiconductor substrate 110 and the TSV 70. In some embodiments, before forming the redistribution structure 80, a thinning process (e.g., grinding, polishing, and/or etching, etc.) is applied to the second surface S2 of one of the tier T1 to accessibly reveal the TSV 70 and to reduce the thickness of the semiconductor substrate 110. In some embodiments, before forming the redistribution structure 80, isolation layer(s) may be formed on the second surface S2 for protection. The redistribution structure 80 may include at least one dielectric pattern 82 and at least one conductive pattern 84 (e.g., lines, vias, pads) disposed in the dielectric pattern 82. The conductive pattern 84 of the redistribution structure 80 may redistribute the underlying circuitry and may reroute the electrical signal of the bonded structure. For example, the conductive pattern 84 and the dielectric pattern 82 may be formed using suitable depositing, patterning, and metallization techniques (e.g., dielectric deposition, lithography, etching, seed layer deposition, plating, planarization, etc.), or other suitable processes. The bottommost one of the conductive pattern 84 may be embedded in the bottommost one of the dielectric pattern 82, and may be in physical and electrical contact with the underlying TSV 70. The topmost one of the conductive pattern 84 may be accessibly revealed by the topmost one of the dielectric pattern 82. In some embodiments, the topmost one of the dielectric pattern 82 may include one or more suitable passivation and/or protective materials in order to provide a degree of protection for the underlying conductive pattern 84. In some embodiments, the topmost one of the conductive pattern 84 includes external contact pad(s) for further electrical connection. For example, the external contact pads are the under-bump metallurgy (UBM) pads for the subsequent ball-mounting process. It should be noted that although a two-layered redistribution structure is illustrated in FIG. 5B, the numbers of dielectric pattern 82 and conductive pattern 84 are not limited thereto.

Still referring to FIG. 5B, external terminal(s) 90 may be formed on the redistribution structure 80. For example, a plurality of external terminals 90 (e.g., conductive balls/bumps) arranged in array are formed on the external contact pads of the topmost one of the conductive pattern 84. In some embodiments, the external terminals 90 may be solder balls formed by ball placement and reflowing processes. In some other embodiments, the external terminals 90 may be or may include copper pillars, controlled collapse chip connection (C4) bumps, micro-bumps, a copper layer, a nickel layer, a lead free (LF) layer, an electroless nickel electroless palladium immersion gold (ENEPIG) layer, a Cu/LF layer, a Sn/Ag layer, a Sn/Pb, combinations of these, or the like. It should be noted that any suitable external terminals, and any suitable process for forming the external terminals, may be utilized for the external terminals 90.

In some embodiments, after forming the external terminal 90, a singulation process may be performed along scribe lines (not shown) to dice the resulted structure into a plurality of semiconductor structures 10A. In some embodiments, the foregoing steps may be performed at wafer-to-wafer level, where the tiers TD1 are provided in a wafer form for bonding, and then the structure shown in FIG. 5B may be singulated into a plurality of semiconductor structures 10A. In other embodiments, the foregoing steps may be performed at the die-to-die level, where the tiers TD1 are singulated from the same or different device wafer(s) into a plurality of semiconductor dies (or chips) before bonding. Alternatively, the foregoing steps may be performed at the die-to-wafer level.

For advanced technologies, more devices are needed to perform more tasks in a single semiconductor die and the real estate on the semiconductor die is very valuable. By forming the conductive connectors 152 passing through the through holes TH of the patterned conductive pad 130 and interposing the patterned dielectric layer 140 between the conductive connector 152 and the patterned conductive pad 130 to resolve device concerns, precious space on semiconductor dies can be saved. Accordingly, the entire size of the semiconductor structure 10A may be reduced.

Figure 6:
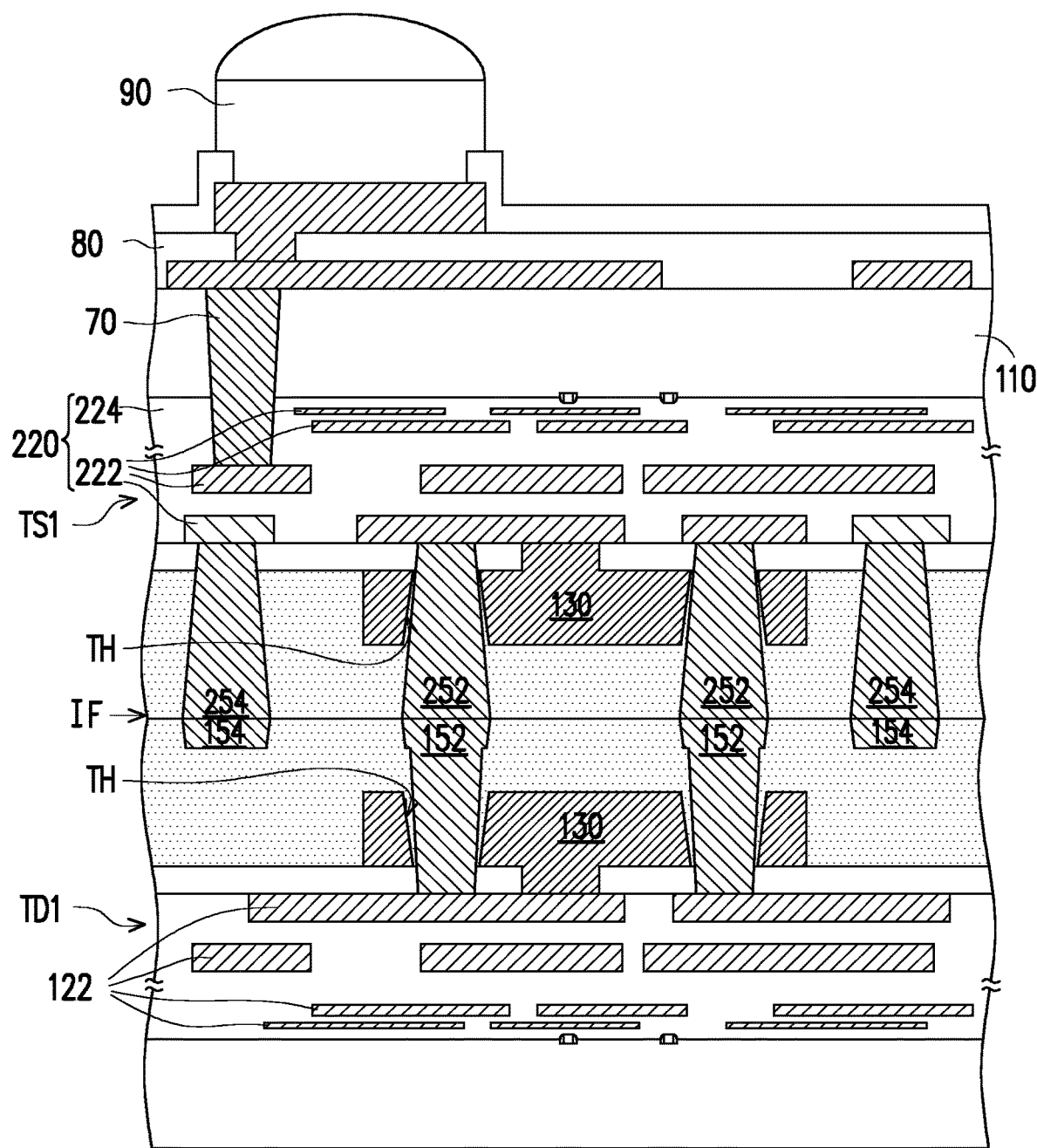
FIG. 6 to FIG. 11 are schematic cross-sectional views showing various semiconductor structures according to some exemplary embodiments of the present disclosure.

FIG. 6 to FIG. 11 are schematic cross-sectional views showing various semiconductor structures according to some exemplary embodiments of the present disclosure. The variations of the embodiments are discussed and like elements throughout the drawings are designated with the same reference numbers for ease of understanding and the details thereof are not repeated herein. Referring to FIG. 6, a semiconductor structure 10B including the tiers TS1 and TD1 is provided. The tier TS1 may be stacked on and bonded to the tier TD1 in a face-to-face configuration using a similar bonding method described in FIG. 5A. Alternatively, the tiers TS1 and TD1 are arranged in a face-to-back configuration, where the first surface of one of the tiers TS1 and TD1 is boned to the second surface of the other one of the tiers TS1 and TD1. For example, a bonding interface IF between the tiers TS1 and TD1 includes dielectric-to-dielectric bonding (e.g., oxide-to-oxide bonding), metal-to-metal bonding (e.g., copper-to-copper bonding), metal-to-dielectric bonding (e.g., copper-to-oxide bonding), any combinations thereof, and/or the like.

In some embodiments, the bonding between the conductive connectors 252 of the tier TS1 and the conductive connectors 152 of the tier TD1 and/or the bonding between the dummy connectors 254 of the tier TS1 and the dummy connectors 154 of the tier TD1 may be via-to-pad bonding. In some embodiments, the via perimeters of the conductive connectors 252 and/or the dummy connectors 254 overlap the pad perimeters of the corresponding conductive connectors 152 and/or the corresponding dummy connectors 154. In some embodiments, the via perimeter may be within the corresponding pad perimeter. In some other embodiments, the via perimeter may be laterally offset from the corresponding pad perimeter. For example, the conductive connectors 252 and the dummy connectors 254 of the tier TS1 may be shifted slightly in one direction (e.g., to the right or left) relative to the conductive connectors 152 and the dummy connectors 154 of the tier TD1 due to formation and/or alignment process variations. It should be noted that the via perimeters and the pad perimeters construe no limitation in the disclosure as long as the conductive connectors 252 and the dummy connectors 254 of the tier TS1 are reliably bonded to the conductive connectors 152 and the dummy connectors of the tier TD1. It is also noted that any number of the tier TS1 and/or the tier TD1 may be stacked vertically in any combination depending on the design requirements, and different tiers may be electrically communicated to one another through at least the conductive connectors, the TSVs, and other conductive features.

In some embodiments, the TSV 70 is formed in the semiconductor substrate 110 and inserts into the dielectric layer 224 of interconnect structure 220 of the tier TS1 to the interconnecting layer 222. Alternatively, the TSV is formed in the tier TD1 of the semiconductor structure 10B. The redistribution structure 80 is formed on the TSV 70 and the semiconductor substrate 110, and the external terminals 90 are formed on the redistribution structure 80 for external electrical connection. As shown in FIG. 6, forming the conductive connectors 152 and 252 passing through the through holes TH of the patterned conductive pads 130 to reach the interconnecting layers 112 and 222 may increase the available routing area of the semiconductor structure 10B.

Figure 7:
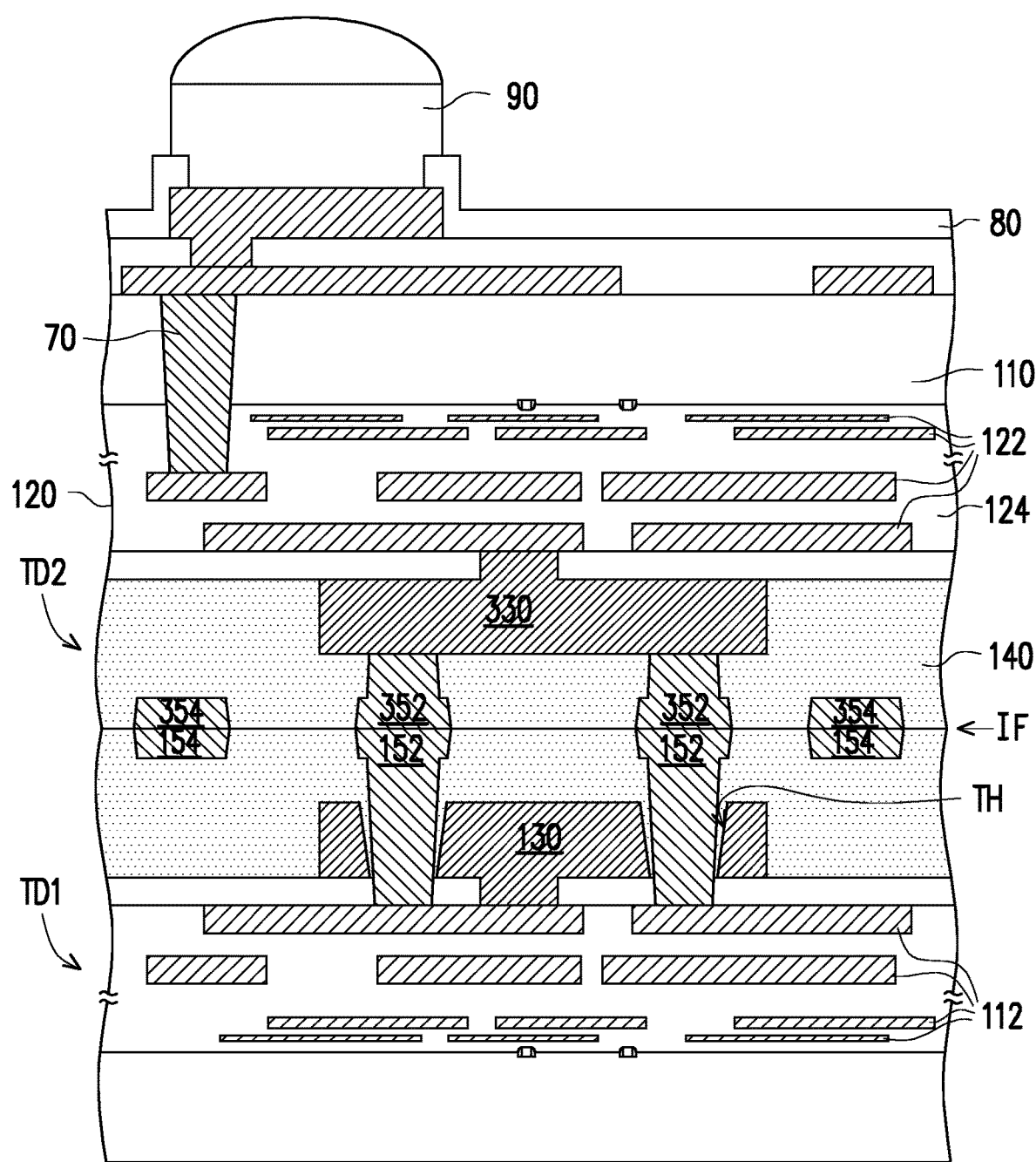

Referring to FIG. 7, a semiconductor structure 10C including the tiers TD1 and TD2 is provided. The tiers TD1 may be stacked on and bonded to one another in a face-to-face configuration using a similar bonding method described in FIG. 5A. Alternatively, the tiers TD1 and TD2 are arranged in a face-to-back configuration, where the first surface of one of the tiers TD1 and TD2 is boned to the second surface of the other one of the tiers TD1 and TD2. For example, a bonding interface IF between the tiers TD1 and TD2 includes dielectric-to-dielectric bonding (e.g., oxide-to-oxide bonding), metal-to-metal bonding (e.g., copper-to-copper bonding), metal-to-dielectric bonding (e.g., copper-to-oxide bonding), any combinations thereof, and/or the like. In some embodiments, the bonding between the conductive connectors 352 of the tier TD2 and the conductive connectors 152 of the tier TD1 and/or the bonding between the dummy connectors 354 of the tier TD2 and the dummy connectors 154 of the tier TD1 may be pad-to-pad bonding. It is noted that any number of the tier TD1 and/or the tier TD2 may be stacked vertically in any combination depending on the design requirements, and different tiers may be electrically communicated to one another through at least the conductive connectors, the TSVs, and other conductive features. In some embodiments, the TSV 70 is formed in the semiconductor substrate 110 and inserts into the dielectric layer 124 of interconnect structure 120 of the tier TD2 to the interconnecting layer 122. Alternatively, the TSV is formed in the tier TD1 of the semiconductor structure 10C. The redistribution structure 80 is formed on the TSV 70 and the semiconductor substrate 110, and the external terminals 90 are formed on the redistribution structure 80 for external electrical connection.

As shown in FIG. 7, forming the conductive connectors 152 passing through the through holes TH of the patterned conductive pad 130 to reach the interconnecting layers 112 of the tier TD1 may increase the available routing area of the semiconductor structure 10C. Since the conductive connectors 352 land on the conductive pad 330 of the tier TD2, the heat generated in the semiconductor structure 10C during operation may be conducted through at least the conductive connectors 352 and the conductive pad 330 to the external terminals 90, and subsequently dissipated, thereby providing better vertical heat dissipation pathways for semiconductor structures that require thermal management.

Figure 8:
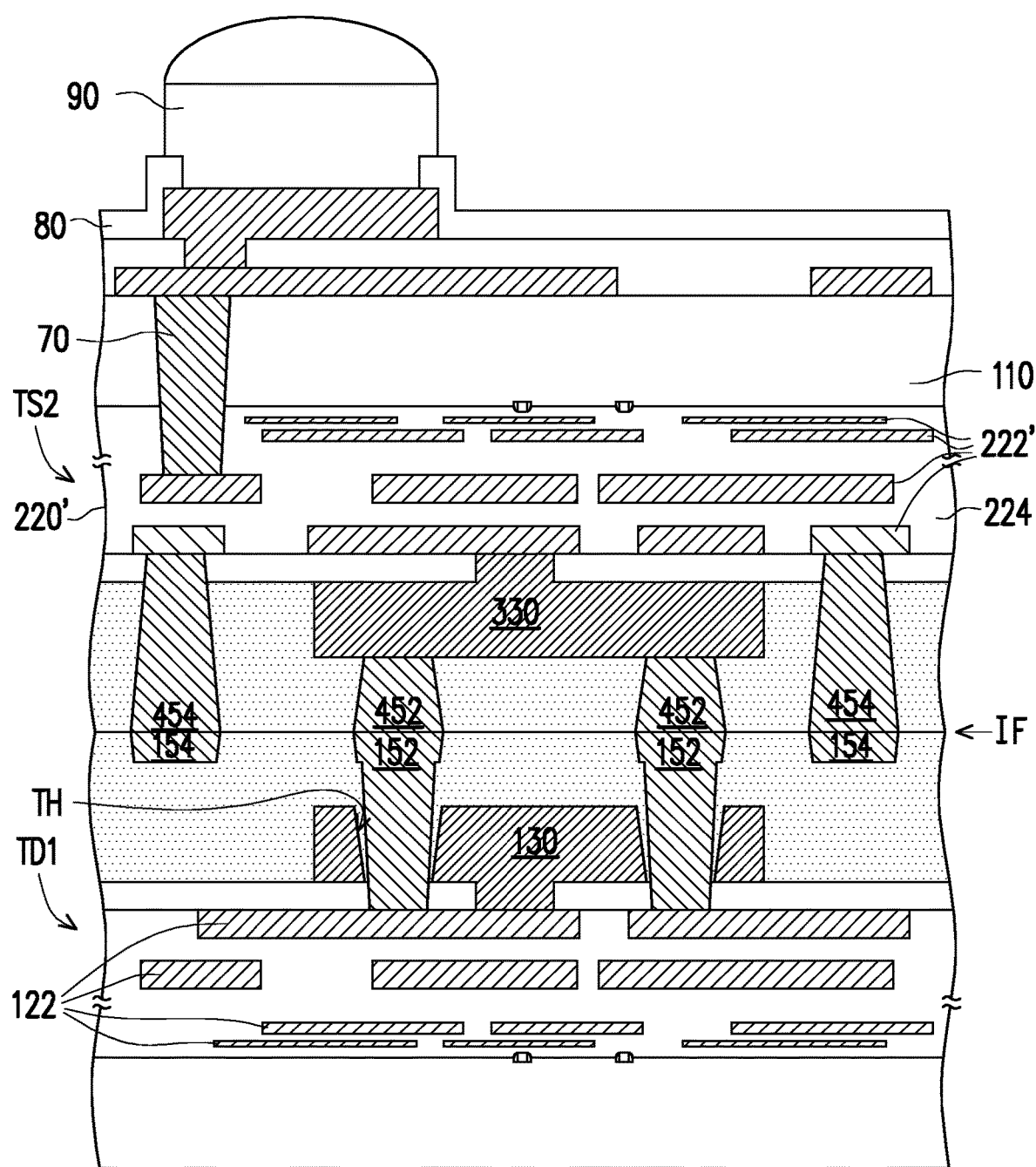

Referring to FIG. 8, a semiconductor structure 10D including the tiers TD1 and TS2 is provided. The tier TS2 may be stacked on and bonded to the tier TD1 in a face-to-face configuration using a similar bonding method described in FIG. 5A. Alternatively, the tiers TD1 and TS2 are arranged in a face-to-back configuration, where the first surface of one of the tiers TD1 and TS2 is boned to the second surface of the other one of the tiers TD1 and TS2. For example, a bonding interface IF between the tiers TS2 and TD1 includes dielectric-to-dielectric bonding (e.g., oxide-to-oxide bonding), metal-to-metal bonding (e.g., copper-to-copper bonding), metal-to-dielectric bonding (e.g., copper-to-oxide bonding), any combinations thereof, and/or the like. In some embodiments, the bonding between the conductive connectors 452 of the tier TS2 and the conductive connectors 152 of the tier TD1 and/or the bonding between the dummy connectors 454 of the tier TS2 and the dummy connectors 154 of the tier TD1 may be via-to-pad bonding. It should be noted that the via perimeters and the pad perimeters construe no limitation in the disclosure as long as the conductive connectors 452 and the dummy connectors 454 of the tier TS2 are reliably bonded to the conductive connectors 152 and the dummy connectors of the tier TD1. It is also noted that any number of the tier TD1 and/or the tier TS2 may be stacked vertically in any combination depending on the design requirements, and different tiers may be electrically communicated to one another through at least the conductive connectors, the TSVs, and other conductive features.

In some embodiments, the TSV 70 is formed in the semiconductor substrate 110 and inserts into the dielectric layer 224 of interconnect structure 220' of the tier TS2 to the active pattern of the interconnecting layer 222. Alternatively, the TSV is formed in the tier TD1 of the semiconductor structure 10D. The redistribution structure 80 is formed on the TSV 70 and the semiconductor substrate 110, and the external terminals 90 are formed on the redistribution structure 80 for external electrical connection. As shown in FIG. 8, forming the conductive connectors 152 passing through the through holes TH of the patterned conductive pad 130 to reach the interconnecting layers 112 of the tier TD1 may increase the available routing area of the semiconductor structure 10D. The conductive connectors 452 of the tier TS2 connected to the conductive pad 330 and the dummy connectors 454 of the tier TS2 connected to the dummy pattern of the interconnect structure 220' may provide greater areas for heat dissipation during operation of the semiconductor structure 10D.

Figure 9:
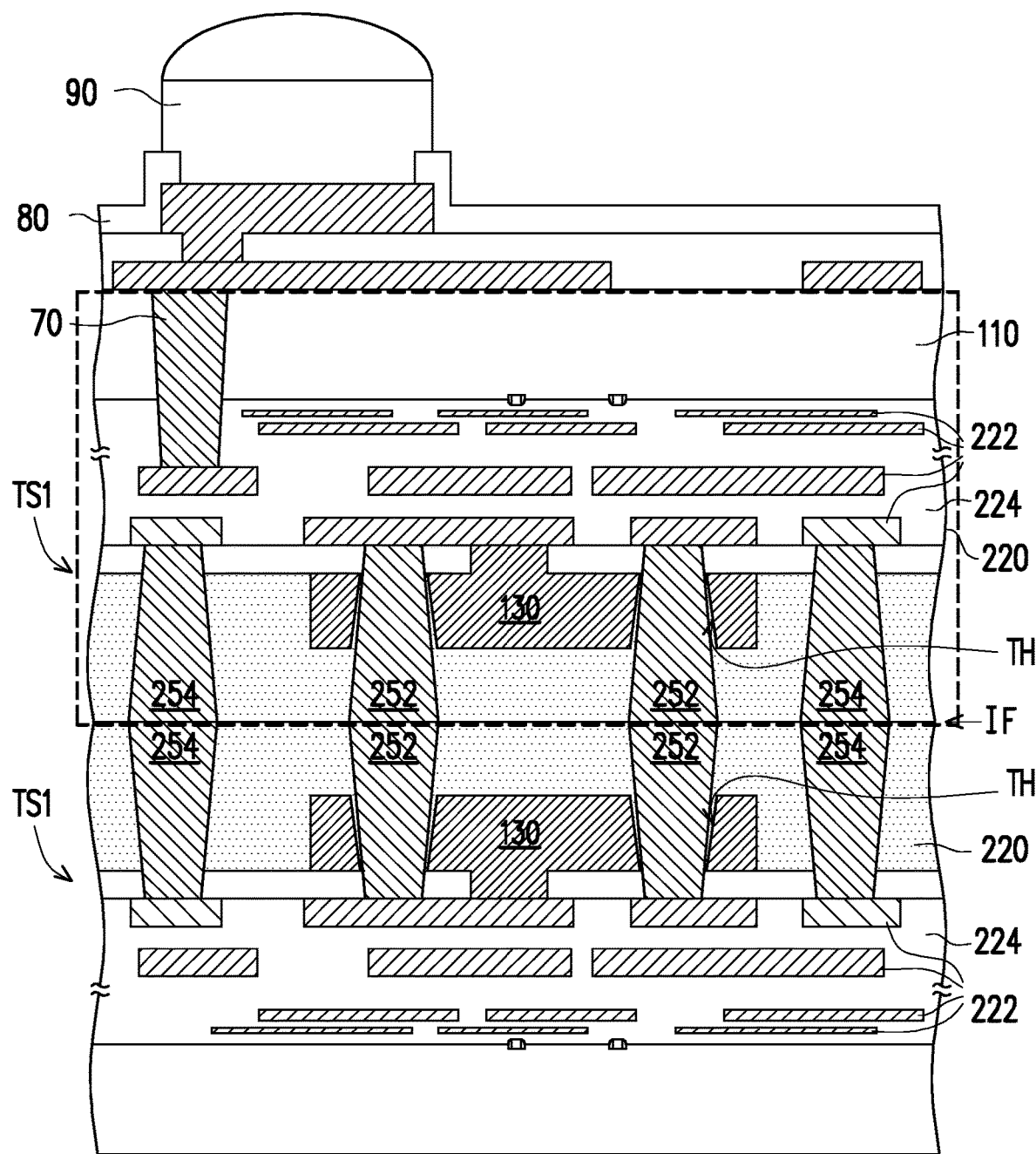

Referring to FIG. 9, a semiconductor structure 10E including two tiers TS1 is provided. For example, two of the tiers TS1 are bonded together in a face-to-face configuration using a similar bonding method described in FIG. 5A. Alternatively, the tiers TS1 are arranged in a face-to-back configuration, where the first surface of one of the tiers TS1 is boned to the second surface of the other one of the tiers TS1. For example, a bonding interface IF between two tiers TS1 includes dielectric-to-dielectric bonding (e.g., oxide-to-oxide bonding), metal-to-metal bonding (e.g., copper-to-copper bonding), metal-to-dielectric bonding (e.g., copper-to-oxide bonding), any combinations thereof, and/or the like. In some embodiments, the bonding between the conductive connectors 252 of two tiers TS1 and/or the bonding between the dummy connectors 254 of the two tiers TS1 may be via-to-via bonding. It should be noted that the via perimeters construe no limitation in the disclosure as long as the conductive connectors 252 and the dummy connectors 254 of two tiers TS1 are reliably bonded to one another. It is also noted that any number of the tiers TS1 may be stacked vertically in any combination depending on the design requirements, and different tiers may be electrically communicated to one another through at least the conductive connectors, the TSVs, and other conductive features.

In some embodiments, the TSV 70 is formed in the semiconductor substrate 110 and inserts into the dielectric layer 224 of interconnect structure 220 of one of the tier TS1 to the interconnecting layer 222. The redistribution structure 80 is formed on the TSV 70 and the semiconductor substrate 110, and the external terminals 90 are formed on the redistribution structure 80 for external electrical connection. As shown in FIG. 9, forming the bonding connectors (e.g., conductive connectors 252) passing through the through holes TH of the patterned conductive pad 130 to reach the interconnecting layers 222 may increase the available layout area, thereby providing improved feasibility of routing in the semiconductor structure 10E. It should be noted that the configuration illustrated in FIG. 9 is merely exemplary. For example, one of the tiers TS1 (e.g., the one encircled by dashed lines) may be replaced by any tier (e.g., the tier TD2 illustrated in FIG. 3C, the tier TS2 illustrated in 4B, etc.) described above with the TSV(s) disposed therein, so that variations thereof may be carried out while still remaining within the scope of the claims and disclosure.

Figure 10:
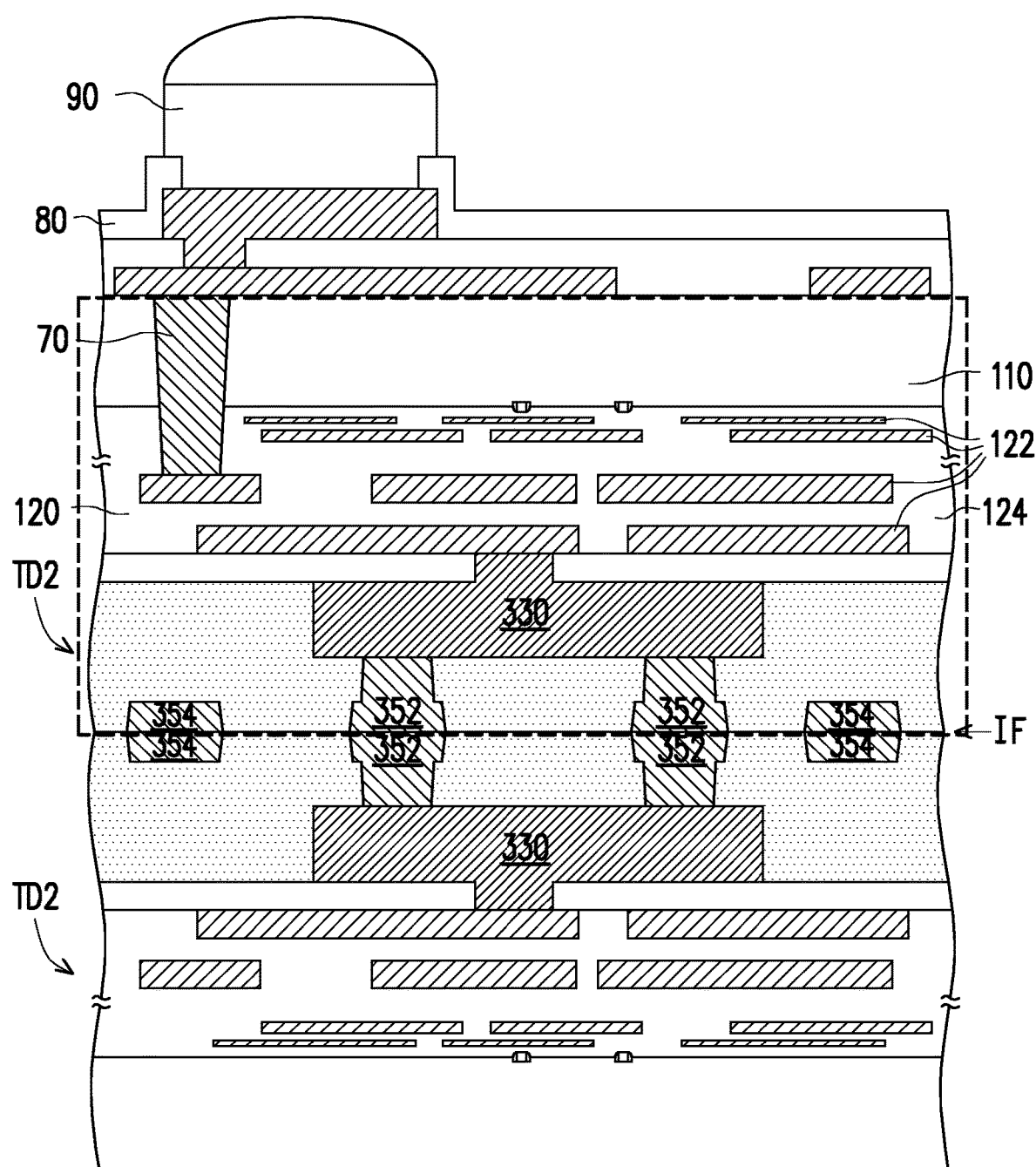

Referring to FIG. 10, a semiconductor structure 10F including two tiers TD2 is provided. For example, two of the tiers TD2 are bonded together in a face-to-face configuration using a similar bonding method described in FIG. 5A. Alternatively, the tiers TD2 are arranged in a face-to-back configuration, where the first surface of one of the tiers TD2 is boned to the second surface of the other one of the tiers TD2. For example, a bonding interface IF between two tiers TD2 includes dielectric-to-dielectric bonding (e.g., oxide-to-oxide bonding), metal-to-metal bonding (e.g., copper-to-copper bonding), metal-to-dielectric bonding (e.g., copper-to-oxide bonding), any combinations thereof, and/or the like. In some embodiments, the bonding between the conductive connectors 352 of two tiers TD2 and/or the bonding between the dummy connectors 354 of the two tiers TD2 may be pad-to-pad bonding. It should be noted that the pad perimeters construe no limitation in the disclosure as long as the conductive connectors 352 and the dummy connectors 354 of two tiers TD2 are reliably bonded to one another. It is also noted that any number of the tiers TD2 may be stacked vertically in any combination depending on the design requirements, and different tiers may be electrically communicated to one another through at least the conductive connectors, the TSVs, and other conductive features.

In some embodiments, the TSV 70 is formed in the semiconductor substrate 110 and inserts into the dielectric layers 124 of interconnect structure 120 of one of the tier TD2 to the interconnecting layer 122. The redistribution structure 80 is formed on the TSV 70 and the semiconductor substrate 110, and the external terminals 90 are formed on the redistribution structure 80 for external electrical connection. As shown in FIG. 10, disposing the conductive connectors 352 from the bonding interface IF to land on the conductive pad 330 may increase the available layout area, thereby providing improved feasibility of routing in the semiconductor structure 10F. The heat generated in the semiconductor structure 10F during operation may be conducted at least from the conductive connectors 352 to the conductive pads 330 so as to provide vertical heat dissipation pathways for stacking structure. It should be noted that the configuration illustrated in FIG. 10 is merely exemplary. For example, one of the tiers TD2 (e.g., the one encircled by dashed lines) may be replaced by any tier (e.g., the tier TS2 illustrated in 4B, etc.) described above with the TSV(s) disposed therein, so that variations thereof may be carried out while still remaining within the scope of the claims and disclosure.

Figure 11:
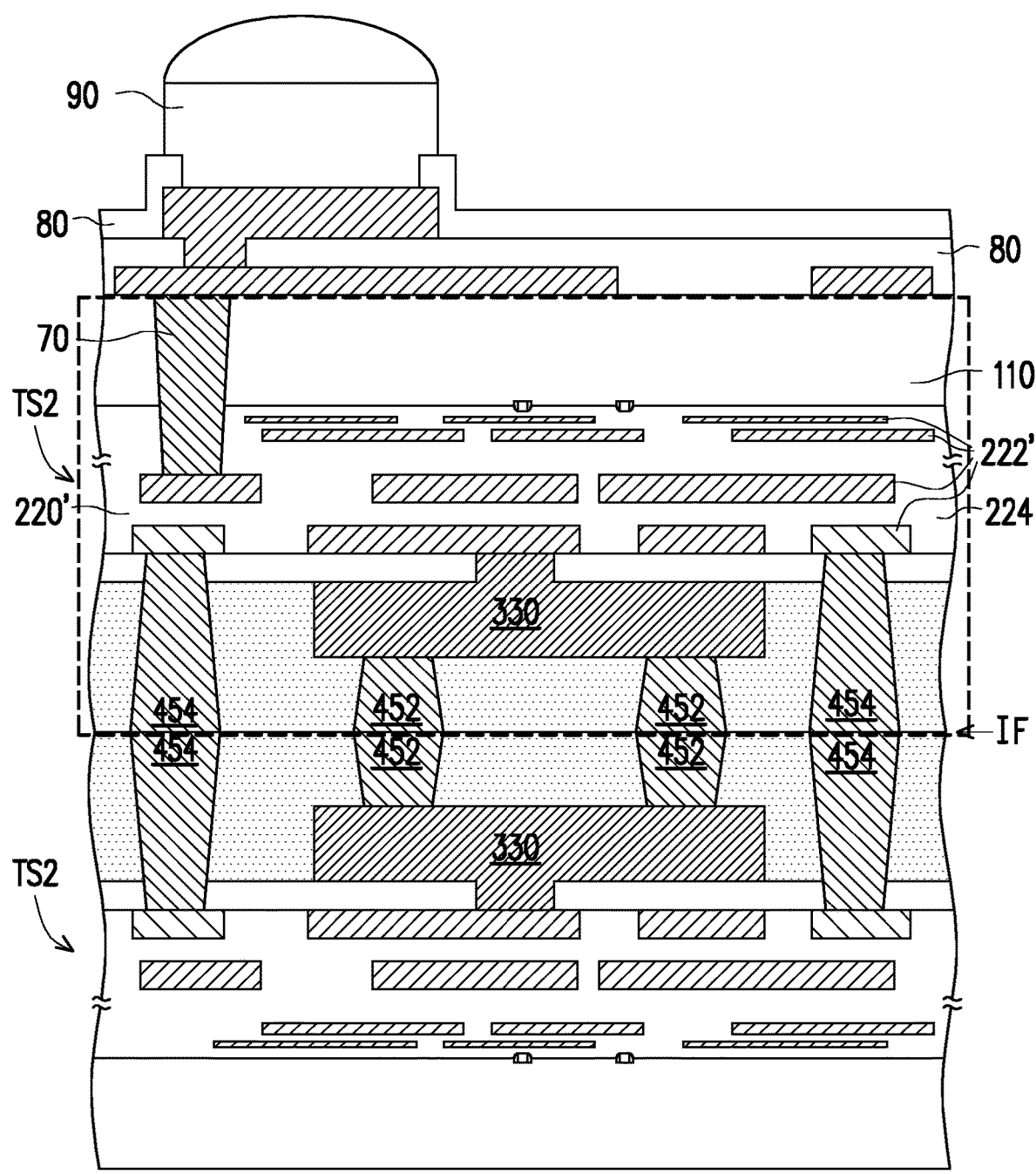

Referring to FIG. 11, a semiconductor structure 10G including two tiers TS2 is provided. For example, two of the tiers TS2 are bonded together in a face-to-face configuration using a similar bonding method described in FIG. 5A. Alternatively, the tiers TS2 are arranged in a face-to-back configuration, where the first surface of one of the tiers TS2 is boned to the second surface of the other one of the tiers TS2. For example, a bonding interface IF between two tiers TS2 includes dielectric-to-dielectric bonding (e.g., oxide-to-oxide bonding), metal-to-metal bonding (e.g., copper-to-copper bonding), metal-to-dielectric bonding (e.g., copper-to-oxide bonding), any combinations thereof, and/or the like. In some embodiments, the bonding between the conductive connectors 452 of two tiers TS2 and/or the bonding between the dummy connectors 454 of the two tiers TS2 may be via-to-via bonding. It should be noted that the via perimeters construe no limitation in the disclosure as long as the conductive connectors 452 and the dummy connectors 454 of the tiers TS2 are reliably bonded to one another. It is also noted that any number of the tiers TS2 may be stacked vertically in any combination depending on the design requirements, and different tiers may be electrically communicated to one another through at least the conductive connectors, the TSVs, and other conductive features.

In some embodiments, the TSV 70 is formed in the semiconductor substrate 110 and inserts into the dielectric layers 224 of interconnect structure 220' of one of the tier TS2 to the interconnecting layer 222'. The redistribution structure 80 is formed on the TSV 70 and the semiconductor substrate 110, and the external terminals 90 are formed on the redistribution structure 80 for external electrical connection. As shown in FIG. 11, disposing the conductive connectors 452 from the bonding interface IF to land on the conductive pad 330 may increase the available layout area, thereby providing improved feasibility of routing in the semiconductor structure 10G. The heat generated in the semiconductor structure 10G during operation may be conducted at least from the conductive connectors 452 to the conductive pads 330 and/or from the dummy connectors 454 to the interconnecting layers 222' so as to provide vertical heat dissipation pathways for stacking structure. It should be noted that the configuration illustrated in FIG. 11 is merely exemplary. For example, one of the tiers TS2 (e.g., the one encircled by dashed lines) may be replaced by any tier described above with the TSV(s) disposed therein, so that variations thereof may be carried out while still remaining within the scope of the claims and disclosure.

Figure 12:
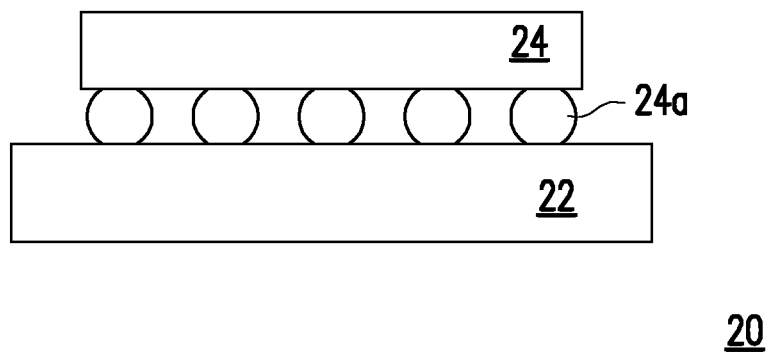
FIG. 12 is a schematic cross-sectional view showing an application of a semiconductor structure according to some exemplary embodiments of the present disclosure.

FIG. 12 is a schematic cross-sectional view showing an application of a semiconductor structure according to some exemplary embodiments of the present disclosure. Referring to FIG. 12, a structure 20 including a first component 22 and a second component 24 disposed over the first component 22 is provided. The first component 22 may be or may include a printed circuit board (PCB), a printed wiring board, interposer, package substrate, and/or other carrier that is capable of carrying integrated circuits. In some embodiments, the second component 24 mounted on the first component 22 is similar to one of the semiconductor structures 10A to 10G described above. For example, one or more the semiconductor structures may be electrically coupled to the first component 22 through the plurality of terminals 24a (e.g., external terminals 90). In some other embodiments, the second component 24 mounted on the first component 22 may be an integrated fan-out (InFO) package including at least one semiconductor structure (e.g., 10A to 10G described above in conjunction with FIG. 5B, and FIG. 6 to FIG. 11) packaged therein. For example, the second component 24 may include a plurality of semiconductor structures (e.g., any combinations of semiconductor structures 10A to 10G) separately and laterally encapsulated by an insulating encapsulation (not shown). The second component 24 may further include a fan-out redistribution structure (not shown) formed on the insulating encapsulation and these semiconductor structures encapsulated by the insulating encapsulation, and the fan-out redistribution structure may be electrically coupled to these semiconductor structures. The second component 24 may further include a plurality of terminals 24a formed on the fan-out redistribution structure to be electrically coupled to the first component 22 and these semiconductor structures through the fan-out redistribution structure. Other packaging techniques may be used to form the structure 20, which are not limited in the disclosure. The structure 20 may be part of an electronic system for such as computers (e.g., high-performance computer), computational devices used in conjunction with an artificial intelligence system, wireless communication devices, computer-related peripherals, entertainment devices, etc. It should be noted that other electronic applications are also possible.

In accordance with some embodiments of the disclosure, a semiconductor structure includes a first semiconductor substrate, a first interconnect structure, a first conductive pad, a first dielectric layer, and a first conductive connector. The first semiconductor substrate includes a plurality of first semiconductor devices therein. The first interconnect structure is disposed over the first semiconductor substrate and electrically coupled to the first semiconductor devices. The first conductive pad is disposed over and electrically coupled to the first interconnect structure. The first dielectric layer covers the first conductive pad and the first interconnect structure, and the first dielectric layer includes a portion extending through the first conductive pad. The first conductive connector is disposed on and electrically coupled to the first interconnect structure, and the first conductive connector extends through the portion of the first dielectric layer.

In accordance with some embodiments of the disclosure, a semiconductor structure includes a first semiconductor die and a second semiconductor die stacked on and bonded to the first semiconductor die. The first semiconductor die includes a first interconnecting layer, a first conductive pad disposed on and electrically coupled to the first interconnecting layer, a first dielectric layer disposed over the first interconnecting layer and covering the first conductive pad, a first conductive connector embedded in the first dielectric layer and extending towards the first conductive pad to be electrically coupled to the first interconnecting layer, and a first dummy connector disposed aside the first conductive connector and embedded in the first dielectric layer. The second semiconductor die a second dielectric layer, a second conductive connector, and a second dummy connector. The second dielectric layer is bonded to the first dielectric layer of the first semiconductor die. The second conductive connector and the second dummy connector are embedded in the second dielectric layer and respectively bonded to the first conductive connector of the first semiconductor die and the first dummy connector of the first semiconductor die.

In accordance with some embodiments of the disclosure, a manufacturing method of a semiconductor structure includes at least the following steps. A patterned conductive pad with a through hole is formed on an interconnect structure over a semiconductor substrate. A dielectric material over the interconnect structure is patterned to form a patterned dielectric layer with a first opening. The first opening passes through a portion of the dielectric material formed inside the through hole of the patterned conductive pad to accessibly expose the interconnect structure. A conductive material is formed inside the first opening of the patterned dielectric layer and in contact with the interconnect structure to form a conductive connector. The conductive connector is laterally isolated from the patterned conductive pad by the patterned dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   a first semiconductor substrate comprising a plurality of first semiconductor devices therein;
   a first interconnect structure disposed over the first semiconductor substrate and electrically coupled to the first semiconductor devices;
   a first conductive pad disposed over and electrically coupled to the first interconnect structure;
   a first dielectric layer covering the first conductive pad and the first interconnect structure, the first dielectric layer comprising a portion extending into a through hole of the first conductive pad;
   a first conductive connector disposed on and electrically coupled to the first interconnect structure, the first conductive connector extending through the portion of the first dielectric layer;
   a second semiconductor substrate comprising a plurality of second semiconductor devices therein;
   a second interconnect structure disposed over the second semiconductor substrate and electrically coupled to the second semiconductor devices;
   a second conductive pad disposed over and electrically coupled to the second interconnect structure;
   a second dielectric layer covering the second conductive pad and the second interconnect structure, the second dielectric layer bonded to the first dielectric layer; and
   a second conductive connector disposed on and electrically coupled to the second interconnect structure, the second conductive connector bonded to the first conductive connector and extending towards the second conductive pad.

2. The semiconductor structure of claim 1, further comprising:
   a dummy connector disposed aside the first conductive connector and embedded in the first dielectric layer.

3. The semiconductor structure of claim 2, wherein
   a depth of the dummy connector in the first dielectric layer is less than a depth of the first conductive connector in the first dielectric layer, and
   a top surface of the dummy connector is substantially leveled with a top surface of the first conductive connector.

4. The semiconductor structure of claim 2, wherein the dummy connector extends from a dummy pattern of the first interconnect structure and penetrates through the first dielectric layer.

5. The semiconductor structure of claim 2, wherein the dummy connector is electrically floating.

6. The semiconductor structure of claim 1, wherein the second conductive connector is electrically coupled to the second interconnect structure through the second conductive pad.

7. The semiconductor structure of claim 1, wherein a portion of the second dielectric layer extends through the second conductive pad, and the second conductive connector extends through the portion of the second dielectric layer.

8. The semiconductor structure of claim 1, further comprising:
a first dummy connector disposed aside the first conductive connector and embedded in the first dielectric layer; and
a second dummy connector disposed aside the second conductive connector and embedded in the second dielectric layer, and the second dummy connector being bonded to the first dummy connector.

9. The semiconductor structure of claim 8, wherein
the first dummy connector penetrates through the first dielectric layer to be in contact with a first dummy pattern of the first interconnect structure, and
the second dummy connector penetrates through the second dielectric layer to be in contact with a second dummy pattern of the second interconnect structure.

10. A semiconductor structure, comprising:
a first semiconductor die comprising:
a first interconnecting layer;
a first conductive pad disposed on and electrically coupled to the first interconnecting layer;
a first dielectric layer disposed over the first interconnecting layer and covering the first conductive pad;
a first conductive connector embedded in the first dielectric layer and extending towards the first conductive pad to be electrically coupled to the first interconnecting layer; and
a first dummy connector disposed aside the first conductive connector and embedded in the first dielectric layer; and
a second semiconductor die stacked on and bonded to the first semiconductor die, the second semiconductor die comprising:
a second dielectric layer bonded to the first dielectric layer of the first semiconductor die; and
a second conductive connector and a second dummy connector embedded in the second dielectric layer and respectively bonded to the first conductive connector of the first semiconductor die and the first dummy connector of the first semiconductor die.

11. The semiconductor structure of claim 10, wherein the first conductive connector extends from a bonding interface between the first semiconductor die and the second semiconductor die and lands on the first conductive pad, and the first conductive connector is electrically coupled to the first interconnecting layer through the first conductive pad.

12. The semiconductor structure of claim 10, wherein
the first conductive connector extends from a bonding interface between the first semiconductor die and the second semiconductor die and penetrates through the first conductive pad to be in contact with the first interconnecting layer, and
the first conductive connector is laterally isolated from the first conductive pad by the first dielectric layer.

13. The semiconductor structure of claim 10, wherein the first dummy connector extends from a bonding interface between the first semiconductor die and the second semiconductor die and penetrates through the first dielectric layer to be in contact with a dummy pattern of the first interconnecting layer.

14. The semiconductor structure of claim 10, wherein the first conductive connector and the first dummy connector are tapered from a bonding interface between the first semiconductor die and the second semiconductor die towards the first interconnecting layer.

15. The semiconductor structure of claim 10, wherein the first dummy connector of the first semiconductor die and the second dummy connector of the second semiconductor die are electrically floating.

16. The semiconductor structure of claim 10, wherein the first semiconductor die further comprises:
a semiconductor substrate comprising a plurality of semiconductor devices therein, wherein the first interconnecting layer is disposed over the semiconductor substrate and electrically coupled to the semiconductor devices; and
a through semiconductor via penetrating through the semiconductor substrate and electrically coupled to the first interconnecting layer.

17. A semiconductor structure, comprising:
a first semiconductor die comprising:
a first dielectric layer covering a first conductive pad; and
a first conductive connector penetrating through the first dielectric layer to be in contact with a first interconnect structure, and the first conductive connector disposed within a through hole of the first conductive pad, wherein a portion of the first dielectric layer disposed in the through hole of the first conductive pad separates the first conductive pad from the first conductive connector; and
a second semiconductor die stacked on the first semiconductor die and comprising:
a second conductive pad bonded to the first conductive pad;
a second dielectric layer covering the second conductive pad and bonded to the first dielectric layer; and
a second conductive connector bonded to the first conductive connector and extending towards the second conductive pad.

18. The semiconductor structure as claimed in claim 17, wherein the first semiconductor die further comprises:
a semiconductor substrate disposed on the first interconnect structure opposite to the first conductive pad; and
a through semiconductor via penetrating through the semiconductor substrate to be connected to the first interconnect structure.

19. The semiconductor structure as claimed in claim 17, wherein the second conductive connector penetrates through the second conductive pad, and a portion of the second dielectric layer is disposed inside the second conductive pad to laterally cover the second conductive connector.

20. The semiconductor structure as claimed in claim 17, wherein the second conductive connector lands on the second conductive pad.

* * * * *